United States Patent
Sung et al.

(10) Patent No.: US 11,616,954 B2
(45) Date of Patent: Mar. 28, 2023

(54) SIGNAL ENCODING METHOD AND APPARATUS AND SIGNAL DECODING METHOD AND APPARATUS

(71) Applicant: SAMSUNG ELECTRONICS CO., LTD., Suwon-si (KR)

(72) Inventors: Ho-sang Sung, Yongin-si (KR); Ki-hyun Choo, Seoul (KR); Eun-mi Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 135 days.

(21) Appl. No.: 17/030,466

(22) Filed: Sep. 24, 2020

(65) Prior Publication Data

US 2021/0051325 A1    Feb. 18, 2021

Related U.S. Application Data

(63) Continuation of application No. 16/259,341, filed on Jan. 28, 2019, now Pat. No. 10,827,175, which is a
(Continued)

(51) Int. Cl.
*G10L 19/032* (2013.01)
*H04N 19/124* (2014.01)
(Continued)

(52) U.S. Cl.
CPC ......... *H04N 19/124* (2014.11); *G10L 19/032* (2013.01); *G10L 19/167* (2013.01);
(Continued)

(58) Field of Classification Search
CPC .... H04N 19/124; H04N 19/196; H04N 19/40; G10L 19/032; G10L 19/167; G10L 19/24;
(Continued)

(56) References Cited

U.S. PATENT DOCUMENTS

| 4,723,161 A | 2/1988 | Koga |
| 5,255,339 A | 10/1993 | Fette et al. |

(Continued)

FOREIGN PATENT DOCUMENTS

| CN | 101836251 A | 9/2010 |
| CN | 101849258 A | 9/2010 |

(Continued)

OTHER PUBLICATIONS

Communication dated Feb. 18, 2022 issued by the Korean Intellectual Property Office in counterpart Korean Application No. 10-2021-0081049.
(Continued)

*Primary Examiner* — Abul K Azad
(74) *Attorney, Agent, or Firm* — Sughrue Mion, PLLC

(57) ABSTRACT

A spectrum coding method includes quantizing spectral data of a current band based on a first quantization scheme, generating a lower bit of the current band using the spectral data and the quantized spectral data, quantizing a sequence of lower bits including the lower bit of the current band based on a second quantization scheme, and generating a bitstream based on a upper bit excluding N bits, where N is 1 or greater, from the quantized spectral data and the quantized sequence of lower bits.

10 Claims, 33 Drawing Sheets

Related U.S. Application Data continuation of application No. 15/500,292, filed as application No. PCT/KR2015/007901 on Jul. 28, 2015, now Pat. No. 10,194,151.

(60) Provisional application No. 62/029,736, filed on Jul. 28, 2014.

(51) Int. Cl.

| | | |
|---|---|---|
| *H04N 19/196* | (2014.01) | |
| *H04N 19/40* | (2014.01) | |
| *G10L 19/16* | (2013.01) | |
| *G10L 19/24* | (2013.01) | |
| *H03M 13/05* | (2006.01) | |
| *H03M 13/15* | (2006.01) | |
| *H03M 13/31* | (2006.01) | |
| *G10L 19/035* | (2013.01) | |
| *G10L 19/038* | (2013.01) | |
| *G10L 19/02* | (2013.01) | |

(52) U.S. Cl.
CPC ............. *G10L 19/24* (2013.01); *H03M 13/05* (2013.01); *H03M 13/156* (2013.01); *H03M 13/31* (2013.01); *H04N 19/196* (2014.11); *H04N 19/40* (2014.11); *G10L 19/0212* (2013.01); *G10L 19/035* (2013.01); *G10L 19/038* (2013.01)

(58) Field of Classification Search
CPC . G10L 19/0212; G10L 19/035; G10L 19/038; G10L 19/0204; H03M 13/05; H03M 13/156; H03M 13/31
See application file for complete search history.

(56) References Cited

U.S. PATENT DOCUMENTS

| | | | |
|---|---|---|---|
| 5,297,170 A | 3/1994 | Eyuboglu et al. | |
| 5,369,724 A | 11/1994 | Lim | |
| 5,412,484 A | 5/1995 | Yoshikawa | |
| 5,727,484 A | 3/1998 | Childs | |
| 6,125,149 A | 9/2000 | Jafarkhani et al. | |
| 6,192,158 B1* | 2/2001 | Abousleman | H04L 27/0004 382/248 |
| 6,504,877 B1 | 1/2003 | Lee | |
| 6,529,604 B1 | 3/2003 | Park et al. | |
| 7,003,171 B1 | 2/2006 | Takeo | |
| 7,020,335 B1* | 3/2006 | Abousleman | H04N 19/63 382/199 |
| 7,414,549 B1 | 8/2008 | Yang et al. | |
| 7,605,727 B2 | 10/2009 | Sung et al. | |
| 7,944,377 B2 | 5/2011 | Sung et al. | |
| 7,965,206 B2 | 6/2011 | Choo et al. | |
| 8,515,767 B2 | 8/2013 | Reznik | |
| 8,527,265 B2 | 9/2013 | Reznik et al. | |
| 8,615,391 B2 | 12/2013 | Kim et al. | |
| 8,706,481 B2 | 4/2014 | Lee et al. | |
| 9,466,308 B2 | 10/2016 | Choo et al. | |
| 9,858,934 B2 | 1/2018 | Porov et al. | |
| 10,109,283 B2 | 10/2018 | Kim et al. | |
| 10,194,151 B2* | 1/2019 | Sung | H03M 13/156 |
| 10,229,692 B2 | 3/2019 | Sung et al. | |
| 10,811,022 B2 | 10/2020 | Choo et al. | |
| 10,827,175 B2* | 11/2020 | Sung | H04N 19/40 |
| 2003/0061055 A1 | 3/2003 | Taori et al. | |
| 2004/0230429 A1 | 11/2004 | Son et al. | |
| 2005/0111543 A1 | 5/2005 | Seo | |
| 2007/0016406 A1 | 1/2007 | Thumpudi et al. | |
| 2007/0168197 A1 | 7/2007 | Vasilache | |
| 2008/0052066 A1 | 2/2008 | Oshikiri et al. | |
| 2008/0126082 A1 | 5/2008 | Ehara et al. | |
| 2009/0030678 A1 | 1/2009 | Kovesi et al. | |
| 2009/0135946 A1 | 5/2009 | Dowling et al. | |
| 2009/0167588 A1 | 7/2009 | Sung et al. | |
| 2009/0232242 A1* | 9/2009 | Xiong | H04L 1/0066 714/792 |
| 2011/0004469 A1 | 1/2011 | Sato et al. | |
| 2012/0278086 A1 | 11/2012 | Fuchs et al. | |
| 2013/0110522 A1 | 5/2013 | Choo et al. | |
| 2013/0279576 A1 | 10/2013 | Chen et al. | |
| 2013/0290003 A1 | 10/2013 | Choo | |
| 2014/0019145 A1 | 1/2014 | Moriya et al. | |
| 2014/0200901 A1 | 7/2014 | Kawashima et al. | |
| 2014/0236581 A1 | 8/2014 | Lee et al. | |
| 2020/0051579 A1 | 2/2020 | Choo et al. | |

FOREIGN PATENT DOCUMENTS

| | | |
|---|---|---|
| CN | 102460570 A | 5/2012 |
| CN | 103023550 A | 4/2013 |
| CN | 103106902 A | 5/2013 |
| CN | 103493131 A | 1/2014 |
| CN | 103650038 A | 3/2014 |
| CN | 103733257 A | 4/2014 |
| EP | 3 109 611 A1 | 12/2016 |
| EP | 3 176 780 A1 | 6/2017 |
| JP | 2000-232366 A | 8/2000 |
| JP | 2005160084 A | 6/2005 |
| JP | 2009-532976 A | 9/2009 |
| KR | 10-2008-0092770 A | 10/2008 |
| KR | 10-2009-0070554 A | 7/2009 |
| KR | 10-2010-0035955 A | 4/2010 |
| KR | 10-2012-0028791 A | 3/2012 |
| KR | 10-2012-0120085 A | 11/2012 |
| KR | 10-2013-0044193 A | 5/2013 |
| WO | 2007/011657 A2 | 1/2007 |
| WO | 2008/047795 A1 | 4/2008 |
| WO | 2008/104663 A1 | 9/2008 |
| WO | 2009/055493 A1 | 4/2009 |
| WO | 2012/137617 A1 | 10/2012 |

OTHER PUBLICATIONS

Communication dated Jan. 11, 2022 issued by the Korean Intellectual Property Office in counterpart Korean Application No. 10-2021-0137837.

S.R. Quackenbush et al., "Noiseless coding of quantized spectral components in MPEG-2 Advanced Audio Coding", Proceedings of 1997 Workshop on Applications of Signal Processing to Audio and Acoustics, IEEE, DOI: 10.1109/ASPAA.1997.625587, 1997, 2 pages total.

"Frame error robust narrow-band and wideband embedded variable bit-rate coding of speech and audio from 8-32 kbit/s", Series G: Transmission Systems and Media, Digital Systems and Networks Digital terminal equipments—Coding of voice and audio signals, International Telecommunication Union, ITU-T, Telecommunication Standardization Sector of ITU, G.718, Recommendation ITU-T G.718, Jun. 2008, 125 pages total.

Communication dated Aug. 20, 2021, issued by the Korean Patent Office in counterpart Korean Patent Application No. 10-2021-0081049.

Communication dated Jan. 19, 2020 issued by the State Intellectual Property Office of P R. China in counterpart Chinese Application No. 201580052356.2.

Communication dated Feb. 12, 2020 issued by the Japanese Intellectual Property Office in counterpart Japanese Application No. 2017-504669.

Communication dated Jun. 25, 2019 issued by the Japanese Patent Office in counterpart Japanese Application No. 2017-504669.

3rd Generation Partnership Project; Technical Specification Group Services and System Aspects; Codec for Enhanced Voice Services(EVS);Detailed Algorithmic Description (Release 12), MDCT Coding Mode, 3GPP Standard; 3 GPP TS 26.445, $3^{rd}$ Generation Partnership Project (3GPP), vol. SAWG4, No. V1.0.0, Release 12 (2014), (pp. 270-408, 139 Pages Total).

(56) References Cited

OTHER PUBLICATIONS

Rongshan Yu et al., "MPEG-4 Scalable to lossless Audio Coding", Audio Engineering Society, Convention Paper 6183, Presented at the 117$^{th}$ convention, (2004), (14 Pages Total).
Communication dated Dec. 20, 2017, from the European Patent Office in counterpart European Application No. 15828104.8.
International Search Report and Written Opinion dated Nov. 30, 2015, issued by the International Searching Authority in counterpart International Application No. PCT/KR2015/007901 (PCT/ISA/210 & 237, and 220).
Aksu et al., "Multistage trellis coded quantisation (MS-TCQ) design and performance"; IEEE, IEEE Proceedings online No. 19971040, Nov. 29, 1996; pp. 61-64.
Communication dated Sep. 30, 2020 issued by Intellectual Property India in Indian Application No. 201727007028.
Communication dated Apr. 8, 2022 by the Korean Intellectual Property Office in counterpart Korean Patent Application No. 10-2017-7002772.
Communication (EP Decision to Refuse) dated Apr. 11, 2022 by the European patent Office in counterpart European Patent Application No. 19201221.9.
Communication (EP Minutes to Oral Proceedings) dated Apr. 11, 2022 by the European patent Office in counterpart European Patent Application No. 19201221.9.
Communication dated Oct. 21, 2022 by the Korean Intellectual Property Office in Korean Patent Application No. 10-2017-7002772.
Communication dated Oct. 17, 2022 by the National Intellectual Property Administration of P.R. China in Chinese Patent Application No. 201911105213.X.
Office Action dated Nov. 29, 2022 by the United States Patent Office in U.S. Appl. No. 17/060,888.
Communication dated Jan. 3, 2023 by the Intellectual Property India in Indian Patent Application No. 202028056630.
Communication dated Feb. 6, 2023, issued by the Korean Intellectual Property Office in Korean Patent Application No. 10-2017-7002772.

* cited by examiner

SIGNAL ENCODING METHOD AND APPARATUS AND SIGNAL DECODING METHOD AND APPARATUS

CROSS-REFERENCE TO RELATED APPLICATIONS

This application is a continuation application of U.S. application Ser. No. 16/259,341, filed Jan. 28, 2019, which is a continuation application of U.S. application Ser. No. 15/500,292, filed Jan. 30, 2017, now U.S. Pat. No. 10,194,151, issued Jan. 29, 2019, which is a National Stage of International Application No. PCT/KR2015/007901, filed Jul. 28, 2015, which claims the benefit of U.S. Patent Application No. 62/029,736, filed Jul. 28, 2014, the disclosures of which are incorporated herein in their entirety by reference.

TECHNICAL FIELD

One or more exemplary embodiments relate to audio or speech signal encoding and decoding, and more particularly, to a method and apparatus for encoding or decoding a spectral coefficient in a frequency domain.

BACKGROUND ART

Quantizers of various schemes have been proposed to efficiently encode spectral coefficients in a frequency domain. For example, there are trellis coded quantization (TCQ), uniform scalar quantization (USQ), factorial pulse coding (FPC), algebraic VQ (AVQ), pyramid VQ (PVQ), and the like, and a lossless encoder optimized for each quantizer may be implemented together.

DETAILED DESCRIPTION OF THE INVENTION

Technical Problem

One or more exemplary embodiments include a method and apparatus for encoding or decoding a spectral coefficient adaptively to various bit rates or various sub-band sizes in a frequency domain.

One or more exemplary embodiments include a computer-readable recording medium having recorded thereon a computer-readable program for executing a signal encoding or decoding method.

One or more exemplary embodiments include a multimedia device employing a signal encoding or decoding apparatus.

Technical Solution

According to one or more exemplary embodiments, a spectrum encoding method includes quantizing spectral data of a current band based on a first quantization scheme, generating a lower bit of the current band using the spectral data and the quantized spectral data, quantizing a sequence of lower bits including the lower bit of the current band based on a second quantization scheme, and generating a bitstream based on a upper bit excluding N bits, where N is 1 or greater, from the quantized spectral data and the quantized sequence of lower bits.

According to one or more exemplary embodiments, a spectrum encoding apparatus includes a processor configured to quantize spectral data of a current band based on a first quantization scheme, generate a lower bit of the current band using the spectral data and the quantized spectral data, quantize a sequence of lower bits including the lower bit of the current band based on a second quantization scheme, and generate a bitstream based on a upper bit excluding N bits, where N is 1 or greater, from the quantized spectral data and the quantized sequence of lower bits.

According to one or more exemplary embodiments, a spectrum decoding method includes receiving a bitstream, decoding a sequence of lower bits by extracting TCQ path information, decoding number, position and sign of ISCs by extracting ISC information, extracting and decoding a remaining bit except for a lower bit, and reconstructing spectrum components based on the decoded sequence of lower bits and the decoded remaining bit except for the lower bit.

According to one or more exemplary embodiments, a spectrum decoding apparatus includes a processor configured to receive a bitstream, decode a sequence of lower bits by extracting TCQ path information, decode number, position and sign of ISCs by extracting ISC information, extract and decode a remaining bit except for a lower bit, and reconstruct spectrum components based on the decoded sequence of lower bits and the decoded remaining bit except for the lower bit.

Advantageous Effects of the Invention

Encoding and decoding of a spectral coefficient adaptive to various bit rates and various sub-band sizes can be performed. In addition, a spectrum coefficient can be encoded by means of a jointed USQ and TCQ by using a bit rate control module designed in a codec supporting multirates. In this case, the respective advantages of both quantization methods can be maximized.

MODE OF THE INVENTION

Figure 1A:
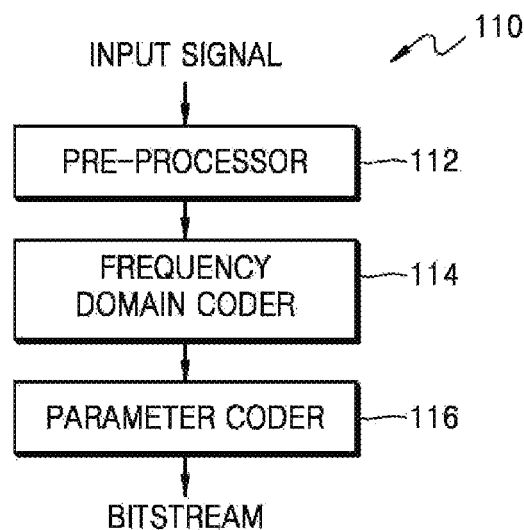
FIGS. 1A and 1B are block diagrams of an audio encoding apparatus and an audio decoding apparatus according to an exemplary embodiment, respectively.

Since the inventive concept may have diverse modified embodiments, preferred embodiments are illustrated in the drawings and are described in the detailed description of the inventive concept. However, this does not limit the inventive concept within specific embodiments and it should be understood that the inventive concept covers all the modifications, equivalents, and replacements within the idea and technical scope of the inventive concept. Moreover, detailed descriptions related to well-known functions or configurations will be ruled out in order not to unnecessarily obscure subject matters of the inventive concept.

It will be understood that although the terms of first and second are used herein to describe various elements, these elements should not be limited by these terms. Terms are only used to distinguish one component from other components.

In the following description, the technical terms are used only for explain a specific exemplary embodiment while not limiting the inventive concept. Terms used in the inventive concept have been selected as general terms which are widely used at present, in consideration of the functions of the inventive concept, but may be altered according to the intent of an operator of ordinary skill in the art, conventional practice, or introduction of new technology. Also, if there is a term which is arbitrarily selected by the applicant in a specific case, in which case a meaning of the term will be described in detail in a corresponding description portion of the inventive concept. Therefore, the terms should be defined on the basis of the entire content of this specification instead of a simple name of each of the terms.

The terms of a singular form may include plural forms unless referred to the contrary. The meaning of 'comprise', 'include', or 'have' specifies a property, a region, a fixed number, a step, a process, an element and/or a component but does not exclude other properties, regions, fixed numbers, steps, processes, elements and/or components.

Hereinafter, exemplary embodiments will be described in detail with reference to the accompanying drawings.

Figure 1B:
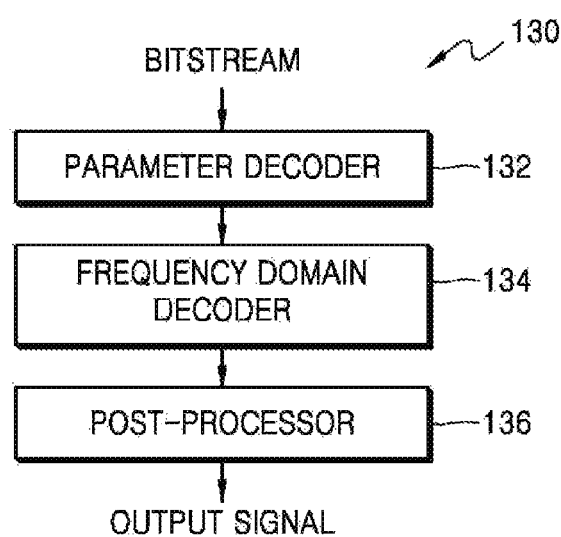

FIGS. 1A and 1B are block diagrams of an audio encoding apparatus and an audio decoding apparatus according to an exemplary embodiment, respectively.

The audio encoding apparatus 110 shown in FIG. 1A may include a pre-processor 112, a frequency domain coder 114, and a parameter coder 116. The components may be integrated in at least one module and may be implemented as at least one processor (not shown).

In FIG. 1A, the pre-processor 112 may perform filtering, down-sampling, or the like for an input signal, but is not limited thereto. The input signal may include a speech signal, a music signal, or a mixed signal of speech and music. Hereinafter, for convenience of explanation, the input signal is referred to as an audio signal.

The frequency domain coder 114 may perform a time-frequency transform on the audio signal provided by the pre-processor 112, select a coding tool in correspondence with the number of channels, a coding band, and a bit rate of the audio signal, and encode the audio signal by using the selected coding tool. The time-frequency transform may use a modified discrete cosine transform (MDCT), a modulated lapped transform (MLT), or a fast Fourier transform (FFT), but is not limited thereto. When the number of given bits is sufficient, a general transform coding scheme may be applied to the whole bands, and when the number of given bits is not sufficient, a bandwidth extension scheme may be applied to partial bands. When the audio signal is a stereo-channel or multi-channel, if the number of given bits is sufficient, encoding is performed for each channel, and if the number of given bits is not sufficient, a down-mixing scheme may be applied. An encoded spectral coefficient is generated by the frequency domain coder 114.

The parameter coder 116 may extract a parameter from the encoded spectral coefficient provided from the frequency domain coder 114 and encode the extracted parameter. The parameter may be extracted, for example, for each sub-band, which is a unit of grouping spectral coefficients, and may have a uniform or non-uniform length by reflecting a critical band. When each sub-band has a non-uniform length, a sub-band existing in a low frequency band may have a relatively short length compared with a sub-band existing in a high frequency band. The number and a length of sub-bands included in one frame vary according to codec algorithms and may affect the encoding performance. The parameter may include, for example a scale factor, power, average energy, or Norm, but is not limited thereto. Spectral coefficients and parameters obtained as an encoding result form a bitstream, and the bitstream may be stored in a storage medium or may be transmitted in a form of, for example, packets through a channel.

The audio decoding apparatus 130 shown in FIG. 1B may include a parameter decoder 132, a frequency domain decoder 134, and a post-processor 136. The frequency domain decoder 134 may include a frame error concealment algorithm or a packet loss concealment algorithm. The components may be integrated in at least one module and may be implemented as at least one processor (not shown).

In FIG. 1B, the parameter decoder 132 may decode parameters from a received bitstream and check whether an error such as erasure or loss has occurred in frame units from the decoded parameters. Various well-known methods may be used for the error check, and information on whether a current frame is a good frame or an erasure or loss frame is provided to the frequency domain decoder 134. Hereinafter, for convenience of explanation, the erasure or loss frame is referred to as an error frame.

When the current frame is a good frame, the frequency domain decoder 134 may generate synthesized spectral coefficients by performing decoding through a general transform decoding process. When the current frame is an error frame, the frequency domain decoder 134 may generate synthesized spectral coefficients by repeating spectral coefficients of a previous good frame (PGF) onto the error frame or by scaling the spectral coefficients of the PGF by a regression analysis to then be repeated onto the error frame, through a frame error concealment algorithm or a packet loss concealment algorithm. The frequency domain decoder 134 may generate a time domain signal by performing a frequency-time transform on the synthesized spectral coefficients.

The post-processor 136 may perform filtering, up-sampling, or the like for sound quality improvement with respect to the time domain signal provided from the frequency domain decoder 134, but is not limited thereto. The post-processor 136 provides a reconstructed audio signal as an output signal.

Figure 2A:
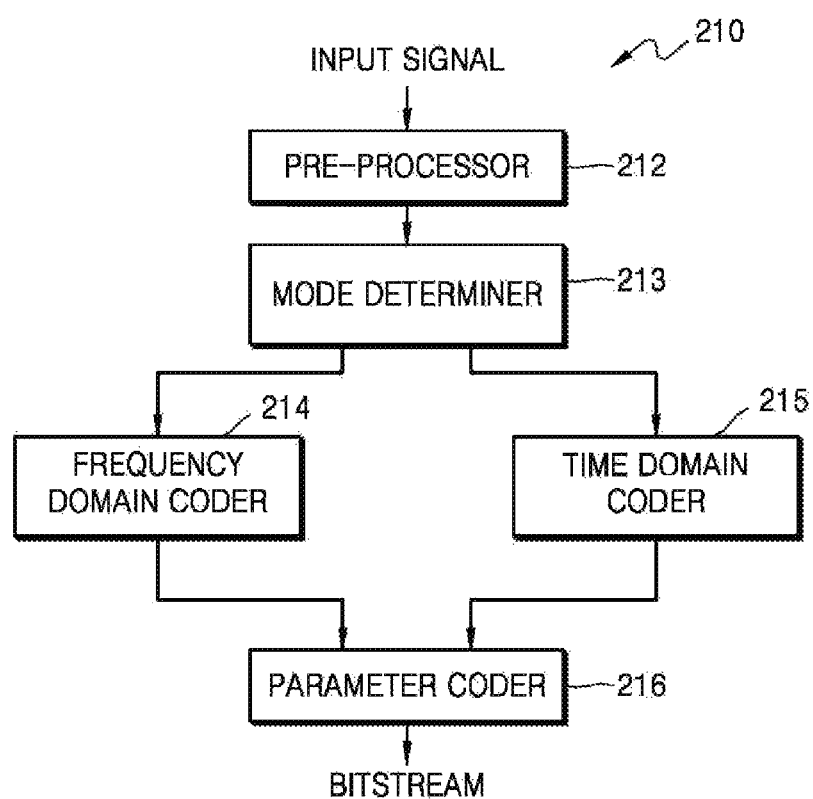
FIGS. 2A and 2B are block diagrams of an audio encoding apparatus and an audio decoding apparatus according to another exemplary embodiment, respectively.
Figure 2B:
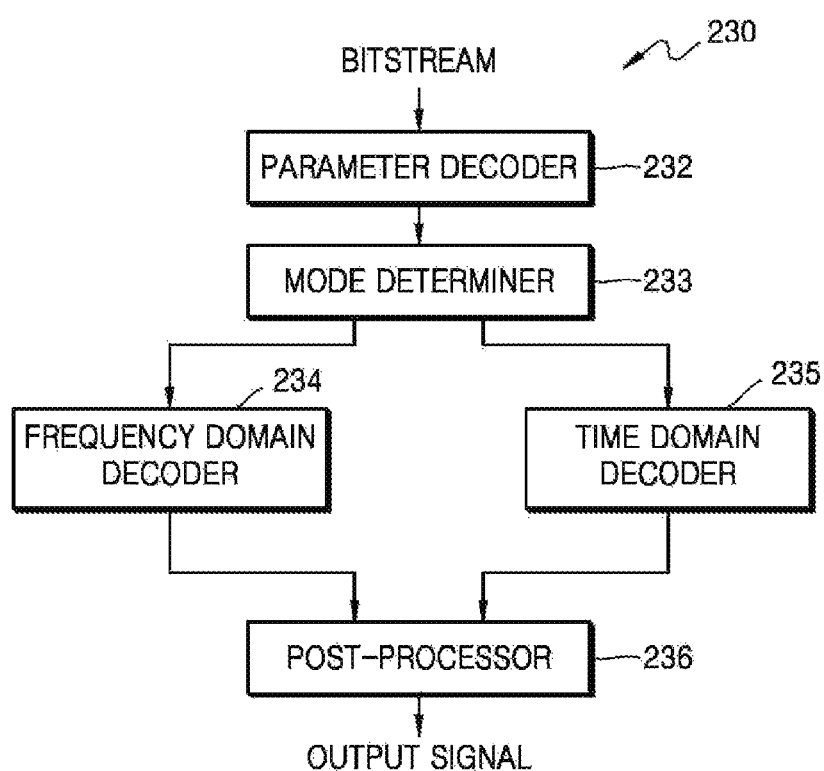

FIGS. 2A and 2B are block diagrams of an audio encoding apparatus and an audio decoding apparatus, according to another exemplary embodiment, respectively, which have a switching structure.

The audio encoding apparatus 210 shown in FIG. 2A may include a pre-processor unit 212, a mode determiner 213, a frequency domain coder 214, a time domain coder 215, and a parameter coder 216. The components may be integrated in at least one module and may be implemented as at least one processor (not shown).

In FIG. 2A, since the pre-processor 212 is substantially the same as the pre-processor 112 of FIG. 1A, the description thereof is not repeated.

The mode determiner 213 may determine a coding mode by referring to a characteristic of an input signal. The mode determiner 213 may determine according to the characteristic of the input signal whether a coding mode suitable for a current frame is a speech mode or a music mode and may also determine whether a coding mode efficient for the current frame is a time domain mode or a frequency domain mode. The characteristic of the input signal may be perceived by using a short-term characteristic of a frame or a long-term characteristic of a plurality of frames, but is not limited thereto. For example, if the input signal corresponds to a speech signal, the coding mode may be determined as the speech mode or the time domain mode, and if the input signal corresponds to a signal other than a speech signal, i.e., a music signal or a mixed signal, the coding mode may be determined as the music mode or the frequency domain mode. The mode determiner 213 may provide an output signal of the pre-processor 212 to the frequency domain coder 214 when the characteristic of the input signal corresponds to the music mode or the frequency domain mode and may provide an output signal of the pre-processor 212 to the time domain coder 215 when the characteristic of the input signal corresponds to the speech mode or the time domain mode.

Since the frequency domain coder 214 is substantially the same as the frequency domain coder 114 of FIG. 1A, the description thereof is not repeated.

The time domain coder 215 may perform code excited linear prediction (CELP) coding for an audio signal provided from the pre-processor 212. In detail, algebraic CELP may be used for the CELP coding, but the CELP coding is not limited thereto. An encoded spectral coefficient is generated by the time domain coder 215.

The parameter coder 216 may extract a parameter from the encoded spectral coefficient provided from the frequency domain coder 214 or the time domain coder 215 and encodes the extracted parameter. Since the parameter coder 216 is substantially the same as the parameter coder 116 of FIG. 1A, the description thereof is not repeated. Spectral coefficients and parameters obtained as an encoding result may form a bitstream together with coding mode information, and the bitstream may be transmitted in a form of packets through a channel or may be stored in a storage medium.

The audio decoding apparatus 230 shown in FIG. 2B may include a parameter decoder 232, a mode determiner 233, a frequency domain decoder 234, a time domain decoder 235, and a post-processor 236. Each of the frequency domain decoder 234 and the time domain decoder 235 may include a frame error concealment algorithm or a packet loss concealment algorithm in each corresponding domain. The components may be integrated in at least one module and may be implemented as at least one processor (not shown).

In FIG. 2B, the parameter decoder 232 may decode parameters from a bitstream transmitted in a form of packets and check whether an error has occurred in frame units from the decoded parameters. Various well-known methods may be used for the error check, and information on whether a current frame is a good frame or an error frame is provided to the frequency domain decoder 234 or the time domain decoder 235.

The mode determiner 233 may check coding mode information included in the bitstream and provide a current frame to the frequency domain decoder 234 or the time domain decoder 235.

The frequency domain decoder 234 may operate when a coding mode is the music mode or the frequency domain mode and generate synthesized spectral coefficients by performing decoding through a general transform decoding process when the current frame is a good frame. When the current frame is an error frame, and a coding mode of a previous frame is the music mode or the frequency domain mode, the frequency domain decoder 234 may generate synthesized spectral coefficients by repeating spectral coefficients of a previous good frame (PGF) onto the error frame or by scaling the spectral coefficients of the PGF by a regression analysis to then be repeated onto the error frame, through a frame error concealment algorithm or a packet loss concealment algorithm. The frequency domain decoder 234 may generate a time domain signal by performing a frequency-time transform on the synthesized spectral coefficients.

The time domain decoder 235 may operate when the coding mode is the speech mode or the time domain mode and generate a time domain signal by performing decoding through a general CELP decoding process when the current frame is a normal frame. When the current frame is an error frame, and the coding mode of the previous frame is the speech mode or the time domain mode, the time domain decoder 235 may perform a frame error concealment algorithm or a packet loss concealment algorithm in the time domain.

The post-processor 236 may perform filtering, up-sampling, or the like for the time domain signal provided from the frequency domain decoder 234 or the time domain decoder 235, but is not limited thereto. The post-processor 236 provides a reconstructed audio signal as an output signal.

Figure 3A:
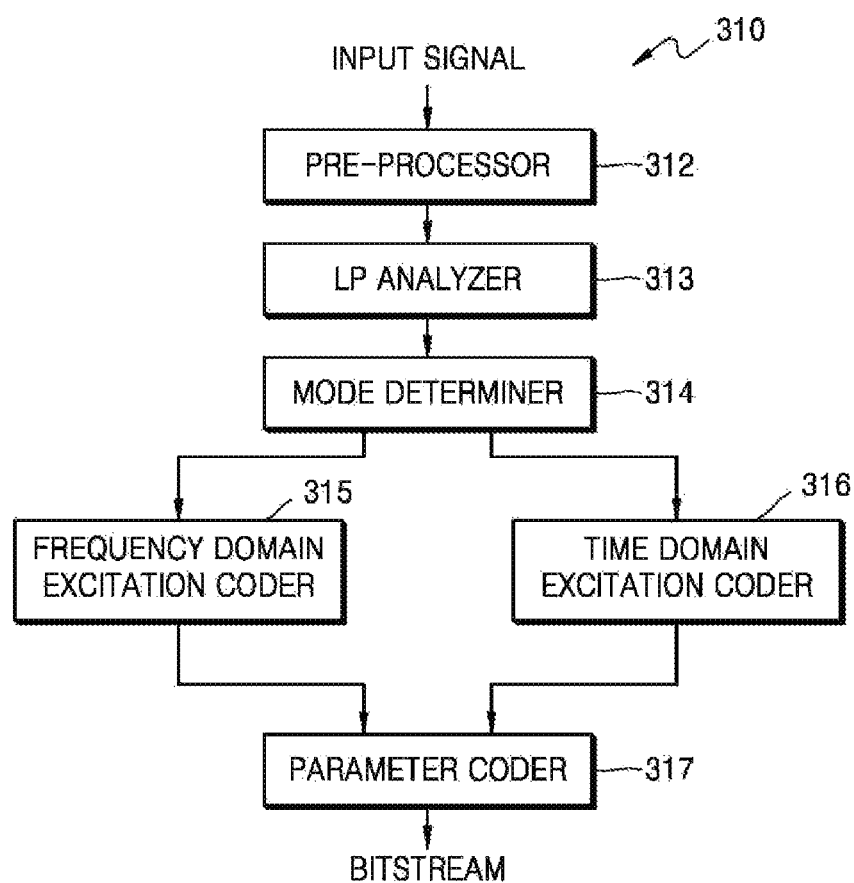
FIGS. 3A and 3B are block diagrams of an audio encoding apparatus and an audio decoding apparatus according to another exemplary embodiment, respectively.
Figure 3B:
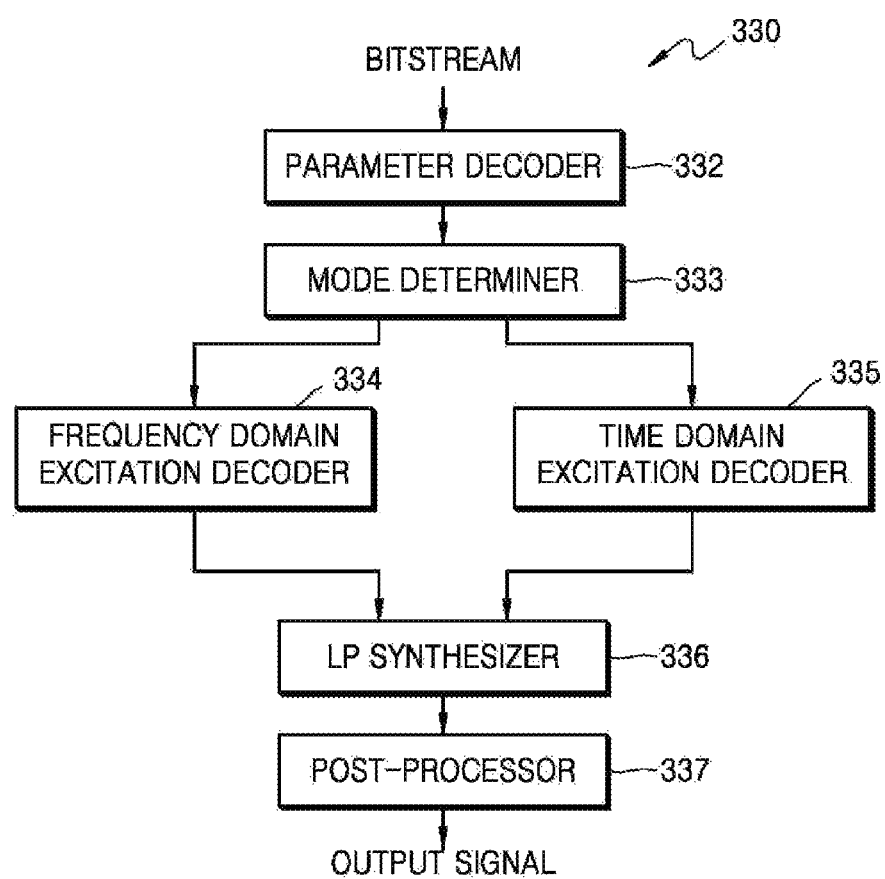

FIGS. 3A and 3B are block diagrams of an audio encoding apparatus and an audio decoding apparatus according to another exemplary embodiment, respectively.

The audio encoding apparatus 310 shown in FIG. 3A may include a pre-processor 312, a linear prediction (LP) analyzer 313, a mode determiner 314, a frequency domain excitation coder 315, a time domain excitation coder 316, and a parameter coder 317. The components may be integrated in at least one module and may be implemented as at least one processor (not shown).

In FIG. 3A, since the pre-processor 312 is substantially the same as the pre-processor 112 of FIG. 1A, the description thereof is not repeated.

The LP analyzer 313 may extract LP coefficients by performing LP analysis for an input signal and generate an excitation signal from the extracted LP coefficients. The excitation signal may be provided to one of the frequency domain excitation coder unit 315 and the time domain excitation coder 316 according to a coding mode.

Since the mode determiner 314 is substantially the same as the mode determiner 213 of FIG. 2A, the description thereof is not repeated.

The frequency domain excitation coder 315 may operate when the coding mode is the music mode or the frequency domain mode, and since the frequency domain excitation coder 315 is substantially the same as the frequency domain coder 114 of FIG. 1A except that an input signal is an excitation signal, the description thereof is not repeated.

The time domain excitation coder 316 may operate when the coding mode is the speech mode or the time domain mode, and since the time domain excitation coder unit 316 is substantially the same as the time domain coder 215 of FIG. 2A, the description thereof is not repeated.

The parameter coder 317 may extract a parameter from an encoded spectral coefficient provided from the frequency domain excitation coder 315 or the time domain excitation coder 316 and encode the extracted parameter. Since the parameter coder 317 is substantially the same as the parameter coder 116 of FIG. 1A, the description thereof is not repeated. Spectral coefficients and parameters obtained as an encoding result may form a bitstream together with coding mode information, and the bitstream may be transmitted in a form of packets through a channel or may be stored in a storage medium.

The audio decoding apparatus 330 shown in FIG. 3B may include a parameter decoder 332, a mode determiner 333, a frequency domain excitation decoder 334, a time domain excitation decoder 335, an LP synthesizer 336, and a post-processor 337. Each of the frequency domain excitation decoder 334 and the time domain excitation decoder 335 may include a frame error concealment algorithm or a packet loss concealment algorithm in each corresponding domain. The components may be integrated in at least one module and may be implemented as at least one processor (not shown).

In FIG. 3B, the parameter decoder 332 may decode parameters from a bitstream transmitted in a form of packets and check whether an error has occurred in frame units from the decoded parameters. Various well-known methods may be used for the error check, and information on whether a current frame is a good frame or an error frame is provided to the frequency domain excitation decoder 334 or the time domain excitation decoder 335.

The mode determiner 333 may check coding mode information included in the bitstream and provide a current frame to the frequency domain excitation decoder 334 or the time domain excitation decoder 335.

The frequency domain excitation decoder 334 may operate when a coding mode is the music mode or the frequency domain mode and generate synthesized spectral coefficients by performing decoding through a general transform decoding process when the current frame is a good frame. When the current frame is an error frame, and a coding mode of a previous frame is the music mode or the frequency domain mode, the frequency domain excitation decoder 334 may generate synthesized spectral coefficients by repeating spectral coefficients of a previous good frame (PGF) onto the error frame or by scaling the spectral coefficients of the PGF by a regression analysis to then be repeated onto the error frame, through a frame error concealment algorithm or a packet loss concealment algorithm. The frequency domain excitation decoder 334 may generate an excitation signal that is a time domain signal by performing a frequency-time transform on the synthesized spectral coefficients.

The time domain excitation decoder 335 may operate when the coding mode is the speech mode or the time domain mode and generate an excitation signal that is a time domain signal by performing decoding through a general CELP decoding process when the current frame is a good frame. When the current frame is an error frame, and the coding mode of the previous frame is the speech mode or the time domain mode, the time domain excitation decoder 335 may perform a frame error concealment algorithm or a packet loss concealment algorithm in the time domain.

The LP synthesizer 336 may generate a time domain signal by performing LP synthesis for the excitation signal provided from the frequency domain excitation decoder 334 or the time domain excitation decoder 335.

The post-processor 337 may perform filtering, up-sampling, or the like for the time domain signal provided from the LP synthesizer 336, but is not limited thereto. The post-processor 337 provides a reconstructed audio signal as an output signal.

Figure 4A:
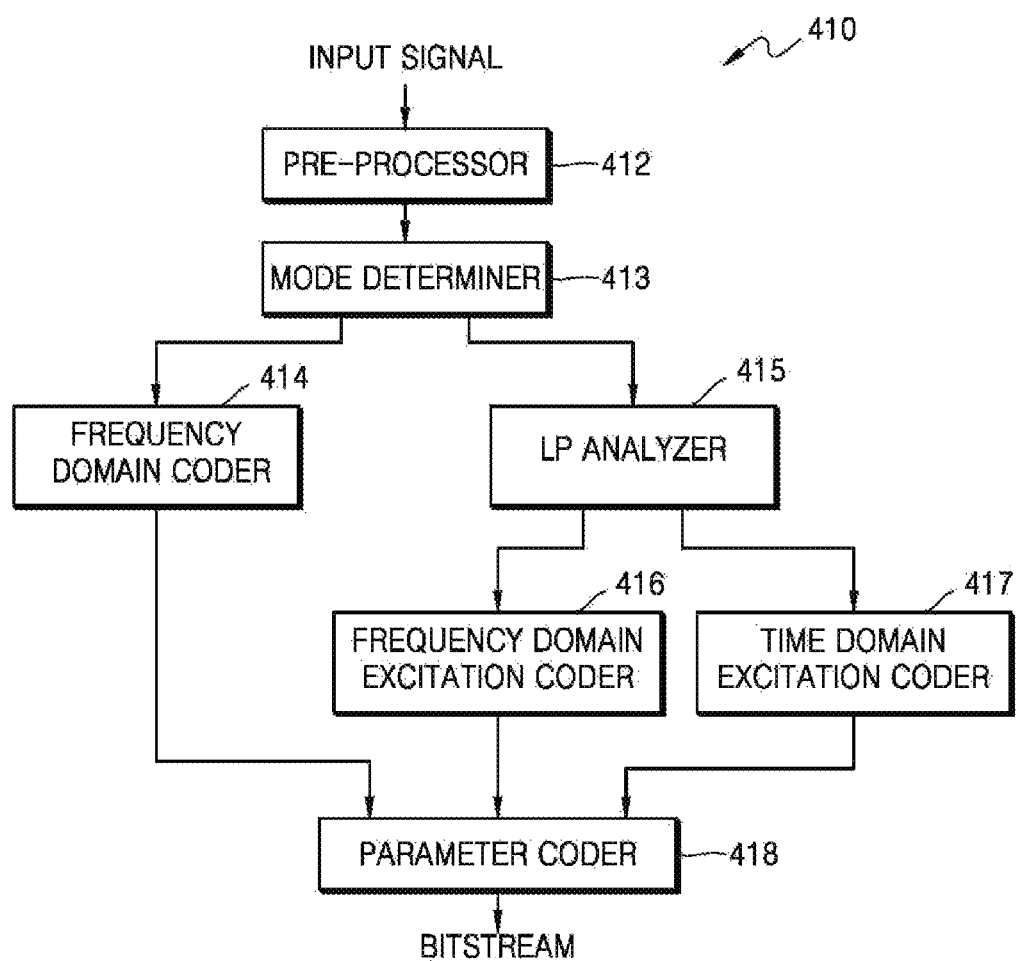
FIGS. 4A and 4B are block diagrams of an audio encoding apparatus and an audio decoding apparatus according to another exemplary embodiment, respectively.
Figure 4B:
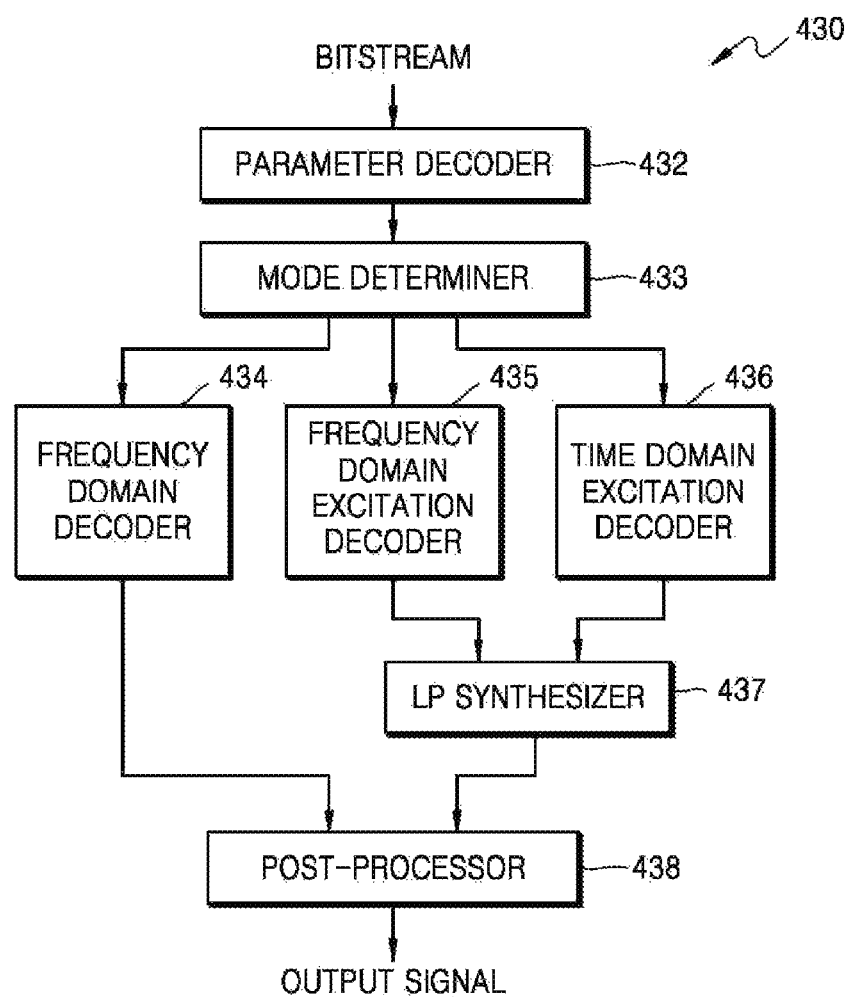

FIGS. 4A and 4B are block diagrams of an audio encoding apparatus and an audio decoding apparatus according to another exemplary embodiment, respectively, which have a switching structure.

The audio encoding apparatus 410 shown in FIG. 4A may include a pre-processor 412, a mode determiner 413, a frequency domain coder 414, an LP analyzer 415, a frequency domain excitation coder 416, a time domain excitation coder 417, and a parameter coder 418. The components may be integrated in at least one module and may be implemented as at least one processor (not shown). Since it can be considered that the audio encoding apparatus 410 shown in FIG. 4A is obtained by combining the audio encoding apparatus 210 of FIG. 2A and the audio encoding apparatus 310 of FIG. 3A, the description of operations of common parts is not repeated, and an operation of the mode determination unit 413 will now be described.

The mode determiner 413 may determine a coding mode of an input signal by referring to a characteristic and a bit rate of the input signal. The mode determiner 413 may determine the coding mode as a CELP mode or another mode based on whether a current frame is the speech mode or the music mode according to the characteristic of the input signal and based on whether a coding mode efficient for the current frame is the time domain mode or the frequency domain mode. The mode determiner 413 may determine the coding mode as the CELP mode when the characteristic of the input signal corresponds to the speech mode, determine the coding mode as the frequency domain mode when the characteristic of the input signal corresponds to the music mode and a high bit rate, and determine the coding mode as an audio mode when the characteristic of the input signal corresponds to the music mode and a low bit rate. The mode determiner 413 may provide the input signal to the frequency domain coder 414 when the coding mode is the frequency domain mode, provide the input signal to the frequency domain excitation coder 416 via the LP analyzer 415 when the coding mode is the audio mode, and provide the input signal to the time domain excitation coder 417 via the LP analyzer 415 when the coding mode is the CELP mode.

The frequency domain coder 414 may correspond to the frequency domain coder 114 in the audio encoding apparatus 110 of FIG. 1A or the frequency domain coder 214 in the audio encoding apparatus 210 of FIG. 2A, and the frequency domain excitation coder 416 or the time domain excitation coder 417 may correspond to the frequency domain excitation coder 315 or the time domain excitation coder 316 in the audio encoding apparatus 310 of FIG. 3A.

The audio decoding apparatus 430 shown in FIG. 4B may include a parameter decoder 432, a mode determiner 433, a frequency domain decoder 434, a frequency domain excitation decoder 435, a time domain excitation decoder 436, an LP synthesizer 437, and a post-processor 438. Each of the frequency domain decoder 434, the frequency domain excitation decoder 435, and the time domain excitation decoder 436 may include a frame error concealment algorithm or a packet loss concealment algorithm in each corresponding domain. The components may be integrated in at least one module and may be implemented as at least one processor (not shown). Since it can be considered that the audio decoding apparatus 430 shown in FIG. 4B is obtained by combining the audio decoding apparatus 230 of FIG. 2B and the audio decoding apparatus 330 of FIG. 3B, the description of operations of common parts is not repeated, and an operation of the mode determiner 433 will now be described.

The mode determiner 433 may check coding mode information included in a bitstream and provide a current frame to the frequency domain decoder 434, the frequency domain excitation decoder 435, or the time domain excitation decoder 436.

The frequency domain decoder 434 may correspond to the frequency domain decoder 134 in the audio decoding apparatus 130 of FIG. 1B or the frequency domain decoder 234 in the audio encoding apparatus 230 of FIG. 2B, and the frequency domain excitation decoder 435 or the time domain excitation decoder 436 may correspond to the frequency domain excitation decoder 334 or the time domain excitation decoder 335 in the audio decoding apparatus 330 of FIG. 3B.

Figure 5:
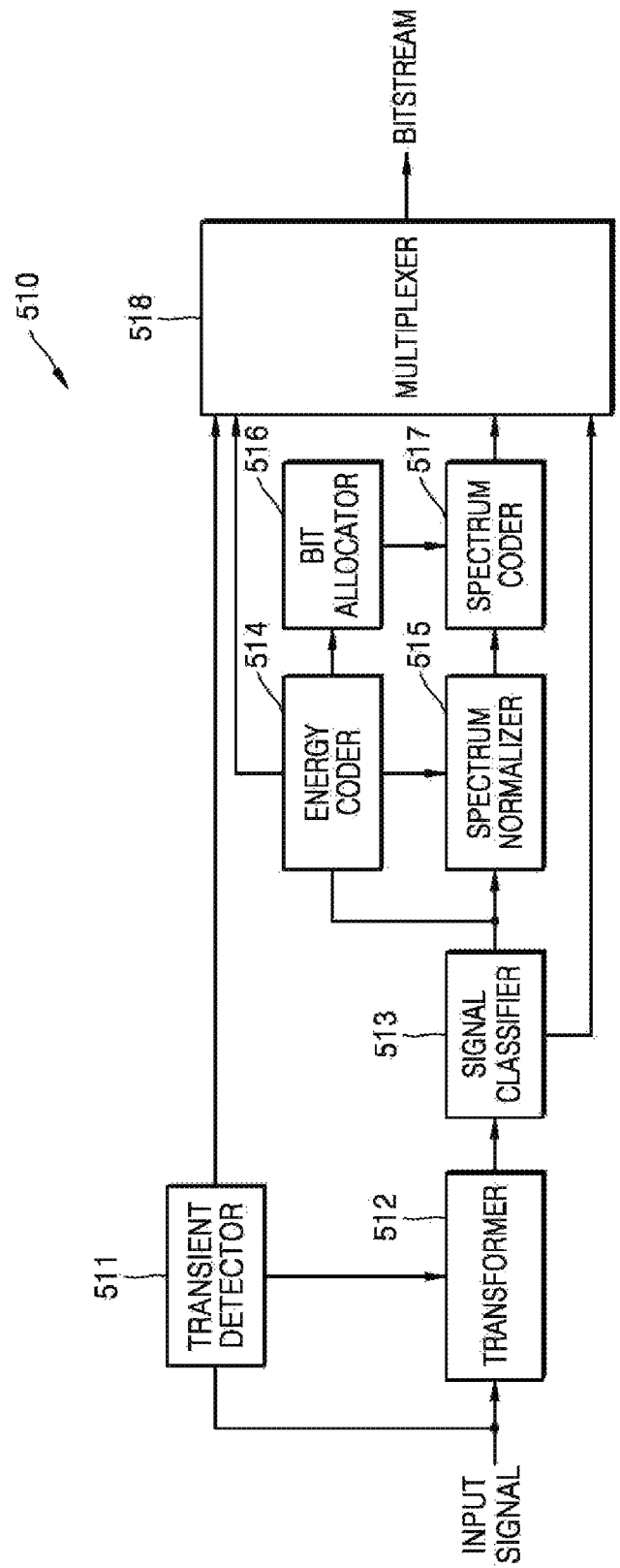
FIG. 5 is a block diagram of a frequency domain audio encoding apparatus according to an exemplary embodiment.

FIG. 5 is a block diagram of a frequency domain audio encoding apparatus according to an exemplary embodiment.

The frequency domain audio encoding apparatus 510 shown in FIG. 5 may include a transient detector 511, a transformer 512, a signal classifier 513, an energy coder 514, a spectrum normalizer 515, a bit allocator 516, a spectrum coder 517, and a multiplexer 518. The components may be integrated in at least one module and may be implemented as at least one processor (not shown). The frequency domain audio encoding apparatus 510 may perform all functions of the frequency domain audio coder 214 and partial functions of the parameter coder 216 shown in FIG. 2. The frequency domain audio encoding apparatus 510 may be replaced by a configuration of an encoder disclosed in the ITU-T G.719 standard except for the signal classifier 513, and the transformer 512 may use a transform window having an overlap duration of 50%. In addition, the frequency domain audio encoding apparatus 510 may be replaced by a configuration of an encoder disclosed in the ITU-T G.719 standard except for the transient detector 511 and the signal classifier 513. In each case, although not shown, a noise level estimation unit may be further included at a rear end of the spectrum coder 517 as in the ITU-T G.719 standard to estimate a noise level for a spectral coefficient to which a bit is not allocated in a bit allocation process and insert the estimated noise level into a bitstream.

Referring to FIG. 5, the transient detector 511 may detect a duration exhibiting a transient characteristic by analyzing an input signal and generate transient signaling information for each frame in response to a result of the detection. Various well-known methods may be used for the detection of a transient duration. According to an exemplary embodiment, the transient detector 511 may primarily determine whether a current frame is a transient frame and secondarily verify the current frame that has been determined as a transient frame. The transient signaling information may be included in a bitstream by the multiplexer 518 and may be provided to the transformer 512.

The transformer 512 may determine a window size to be used for a transform according to a result of the detection of a transient duration and perform a time-frequency transform based on the determined window size. For example, a short window may be applied to a sub-band from which a transient duration has been detected, and a long window may be applied to a sub-band from which a transient duration has not been detected. As another example, a short window may be applied to a frame including a transient duration.

The signal classifier 513 may analyze a spectrum provided from the transformer 512 in frame units to determine whether each frame corresponds to a harmonic frame. Various well-known methods may be used for the determination of a harmonic frame. According to an exemplary embodiment, the signal classifier 513 may divide the spectrum provided from the transformer 512 into a plurality of sub-bands and obtain a peak energy value and an average energy value for each sub-band. Thereafter, the signal classifier 513 may obtain the number of sub-bands of which a peak energy value is greater than an average energy value by a predetermined ratio or above for each frame and determine, as a harmonic frame, a frame in which the obtained number of sub-bands is greater than or equal to a predetermined value. The predetermined ratio and the predetermined value may be determined in advance through experiments or simulations. Harmonic signaling information may be included in the bitstream by the multiplexer 518.

The energy coder 514 may obtain energy in each sub-band unit and quantize and lossless-encode the energy. According to an embodiment, a Norm value corresponding to average spectral energy in each sub-band unit may be used as the energy and a scale factor or a power may also be used, but the energy is not limited thereto. The Norm value of each sub-band may be provided to the spectrum normalizer 515 and the bit allocator 516 and may be included in the bitstream by the multiplexer 518.

The spectrum normalizer 515 may normalize the spectrum by using the Norm value obtained in each sub-band unit.

The bit allocator 516 may allocate bits in integer units or fraction units by using the Norm value obtained in each sub-band unit. In addition, the bit allocator 516 may calculate a masking threshold by using the Norm value obtained in each sub-band unit and estimate the perceptually required number of bits, i.e., the allowable number of bits, by using the masking threshold. The bit allocator 516 may limit that the allocated number of bits does not exceed the allowable number of bits for each sub-band. The bit allocator 516 may sequentially allocate bits from a sub-band having a larger Norm value and weigh the Norm value of each sub-band according to perceptual importance of each sub-band to adjust the allocated number of bits so that a more number of bits are allocated to a perceptually important sub-band. The quantized Norm value provided from the energy coder 514 to the bit allocator 516 may be used for the bit allocation after being adjusted in advance to consider psychoacoustic weighting and a masking effect as in the ITU-T G.719 standard.

The spectrum coder 517 may quantize the normalized spectrum by using the allocated number of bits of each sub-band and lossless-encode a result of the quantization. For example, TCQ, USQ, FPC, AVQ and PVQ or a combination thereof and a lossless encoder optimized for each quantizer may be used for the spectrum encoding. In addition, a trellis coding may also be used for the spectrum encoding, but the spectrum encoding is not limited thereto. Moreover, a variety of spectrum encoding methods may also be used according to either environments in which a corresponding codec is embodied or a user's need. Information on the spectrum encoded by the spectrum coder 517 may be included in the bitstream by the multiplexer 518.

Figure 6:
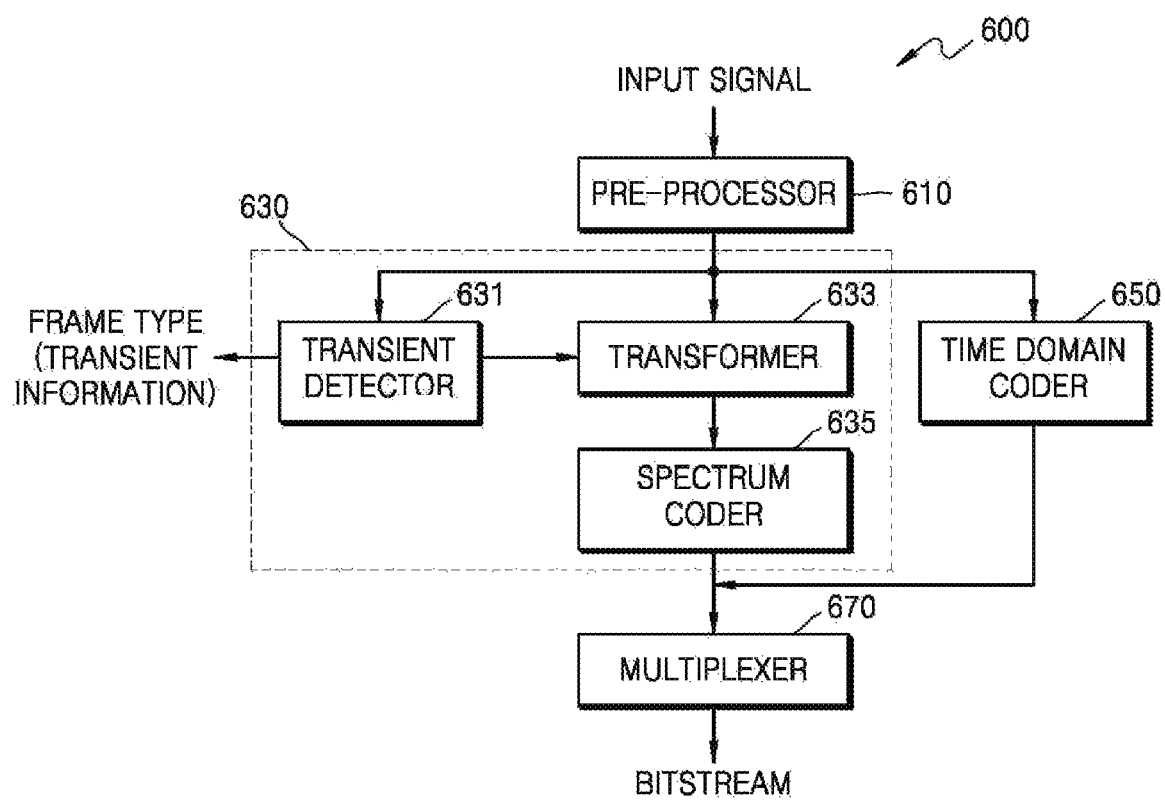
FIG. 6 is a block diagram of a frequency domain audio decoding apparatus according to an exemplary embodiment.

FIG. 6 is a block diagram of a frequency domain audio encoding apparatus according to an exemplary embodiment.

The frequency domain audio encoding apparatus 600 shown in FIG. 6 may include a pre-processor 610, a frequency domain coder 630, a time domain coder 650, and a multiplexer 670. The frequency domain coder 630 may include a transient detector 631, a transformer 633 and a spectrum coder 635. The components may be integrated in at least one module and may be implemented as at least one processor (not shown).

Referring to FIG. 6, the pre-processor 610 may perform filtering, down-sampling, or the like for an input signal, but is not limited thereto. The pre-processor 610 may determine a coding mode according to a signal characteristic. The pre-processor 610 may determine according to a signal characteristic whether a coding mode suitable for a current frame is a speech mode or a music mode and may also determine whether a coding mode efficient for the current frame is a time domain mode or a frequency domain mode. The signal characteristic may be perceived by using a short-term characteristic of a frame or a long-term characteristic of a plurality of frames, but is not limited thereto. For example, if the input signal corresponds to a speech signal, the coding mode may be determined as the speech mode or the time domain mode, and if the input signal corresponds to a signal other than a speech signal, i.e., a music signal or a mixed signal, the coding mode may be determined as the music mode or the frequency domain mode. The pre-processor 610 may provide an input signal to the frequency domain coder 630 when the signal characteristic corresponds to the music mode or the frequency domain mode and may provide an input signal to the time domain coder 660 when the signal characteristic corresponds to the speech mode or the time domain mode.

The frequency domain coder 630 may process an audio signal provided from the pre-processor 610 based on a transform coding scheme. In detail, the transient detector 631 may detect a transient component from the audio signal and determine whether a current frame corresponds to a transient frame. The transformer 633 may determine a length or a shape of a transform window based on a frame type, i.e. transient information provided from the transient detector 631 and may transform the audio signal into a frequency domain based on the determined transform window. As an example of a transform tool, a modified discrete cosine transform (MDCT), a fast Fourier transform (FFT) or a modulated lapped transform (MLT) may be used. In general, a short transform window may be applied to a frame including a transient component. The spectrum coder 635 may perform encoding on the audio spectrum transformed into the frequency domain. The spectrum coder 635 will be described below in more detail with reference to FIGS. 7 and 9.

The time domain coder 650 may perform code excited linear prediction (CELP) coding on an audio signal provided from the pre-processor 610. In detail, algebraic CELP may be used for the CELP coding, but the CELP coding is not limited thereto.

The multiplexer 670 may multiplex spectral components or signal components and variable indices generated as a result of encoding in the frequency domain coder 630 or the time domain coder 650 so as to generate a bitstream. The bitstream may be stored in a storage medium or may be transmitted in a form of packets through a channel.

Figure 7:
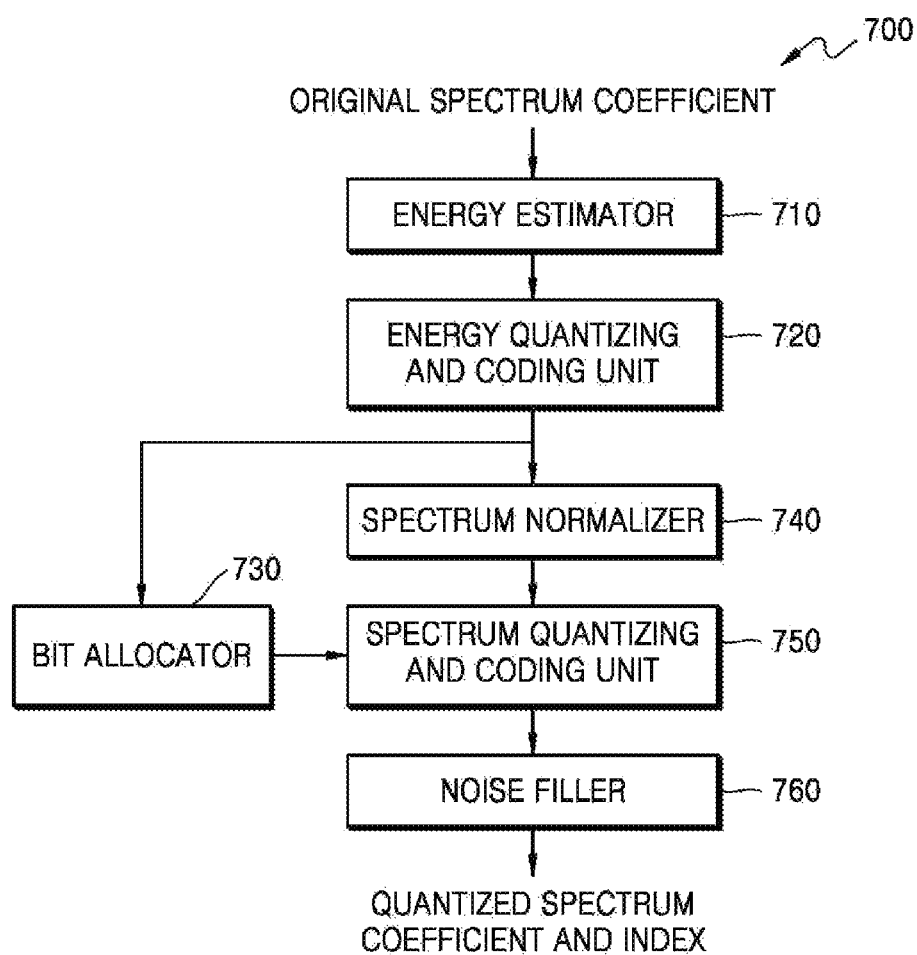
FIG. 7 is a block diagram of a spectrum encoding apparatus according to an exemplary embodiment.

FIG. 7 is a block diagram of a spectrum encoding apparatus according to an exemplary embodiment. The spectrum encoding apparatus shown in FIG. 7 may correspond to the spectrum coder 635 of FIG. 6, may be included in another frequency domain encoding apparatus, or may be implemented independently.

The spectrum encoding apparatus shown in FIG. 7 may include an energy estimator 710, an energy quantizing and coding unit 720, a bit allocator 730, a spectrum normalizer 740, a spectrum quantizing and coding unit 750 and a noise filler 760.

Referring to FIG. 7, the energy estimator 710 may divide original spectral coefficients into a plurality of sub-bands and estimate energy, for example, a Norm value for each sub-band. Each sub-band may have a uniform length in a frame. When each sub-band has a non-uniform length, the number of spectral coefficients included in a sub-band may be increased from a low frequency to a high frequency band.

The energy quantizing and coding unit 720 may quantize and encode an estimated Norm value for each sub-band. The Norm value may be quantized by means of variable tools such as vector quantization (VQ), scalar quantization (SQ), trellis coded quantization (TCQ), lattice vector quantization (LVQ), etc. The energy quantizing and coding unit 720 may additionally perform lossless coding for further increasing coding efficiency.

The bit allocator 730 may allocate bits required for coding in consideration of allowable bits of a frame, based on the quantized Norm value for each sub-band.

The spectrum normalizer 740 may normalize the spectrum based on the Norm value obtained for each sub-band.

The spectrum quantizing and coding unit 750 may quantize and encode the normalized spectrum based on allocated bits for each sub-band.

The noise filler 760 may add noises into a component quantized to zero due to constraints of allowable bits in the spectrum quantizing and coding unit 750.

Figure 8:
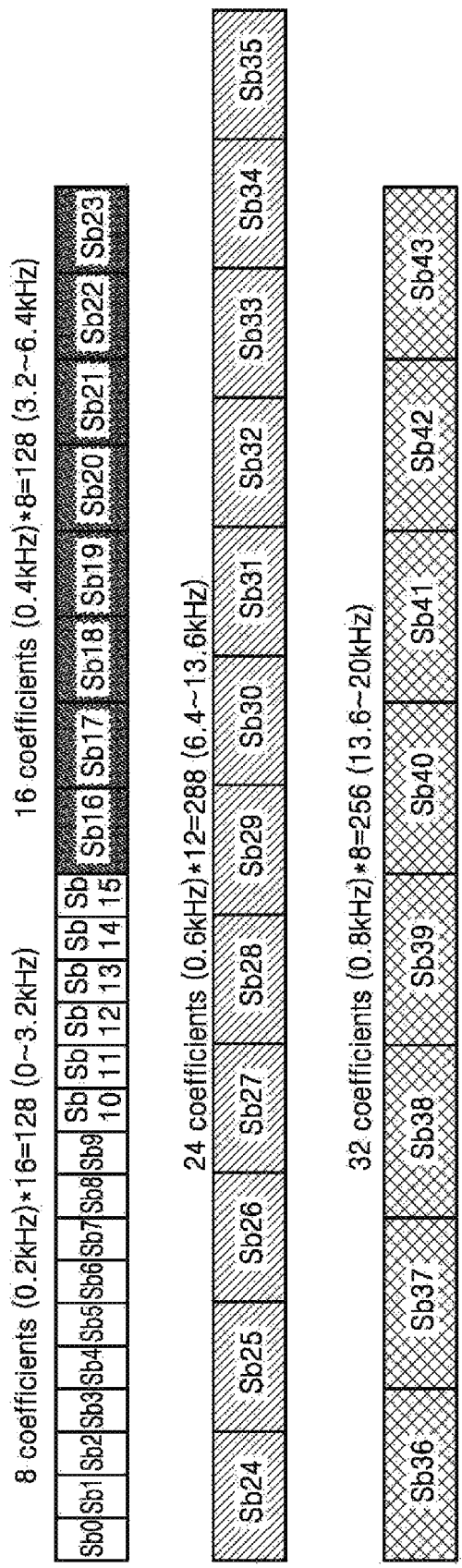
FIG. 8 illustrates sub-band segmentation.

FIG. 8 illustrates sub-band segmentation.

Referring to FIG. 8, when an input signal uses a sampling frequency of 48 KHz and has a frame size of 20 ms, the number of samples to be processed for each frame becomes 960. That is, when the input signal is transformed by using MDCT with 50% overlapping, 960 spectral coefficients are obtained. A ratio of overlapping may be variably set according a coding scheme. In a frequency domain, a band up to 24 KHz may be theoretically processed and a band up to 20 KHz may be represented in consideration of an audible range. In a low band of 0 to 3.2 KHz, a sub-band comprises 8 spectral coefficients. In a band of 3.2 to 6.4 KHz, a sub-band comprises 16 spectral coefficients. In a band of 6.4 to 13.6 KHz, a sub-band comprises 24 spectral coefficients. In a band of 13.6 to 20 KHz, a sub-band comprises 32 spectral coefficients. For a predetermined band set in an encoding apparatus, coding based on a Norm value may be performed and for a high band above the predetermined band, coding based on variable schemes such as band extension may be applied.

Figure 9:
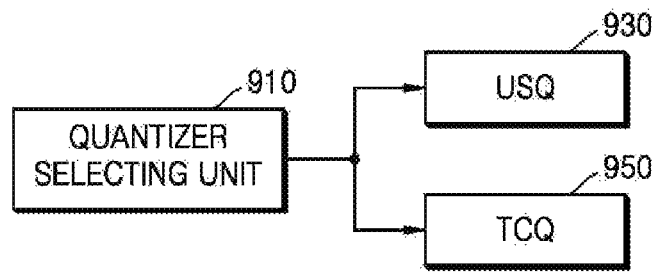
FIG. 9 is a block diagram of a spectrum quantization apparatus according to an exemplary embodiment.

FIG. 9 is a block diagram illustrating a configuration of a spectrum quantization apparatus according to an exemplary embodiment.

The apparatus shown in FIG. 9 may include a quantizer selecting unit 910, a USQ 930, and a TCQ 950.

In FIG. 9, the quantizer selecting unit 910 may select the most efficient quantizer from among various quantizers according to the characteristic of a signal to be quantized, i.e. an input signal. As the characteristic of the input signal, bit allocation information for each band, band size information, and the like are usable. According to a result of the selection, the signal to be quantized may be provided to one of the USQ 830 and the TCQ 850 so that corresponding quantization is performed. The input signal may be a normalized MDCT spectrum. The bandwidth of the input signal may be either a narrow band (NB) or a wide band (WB). The coding mode of the input signal may be a normal mode.

Figure 10:
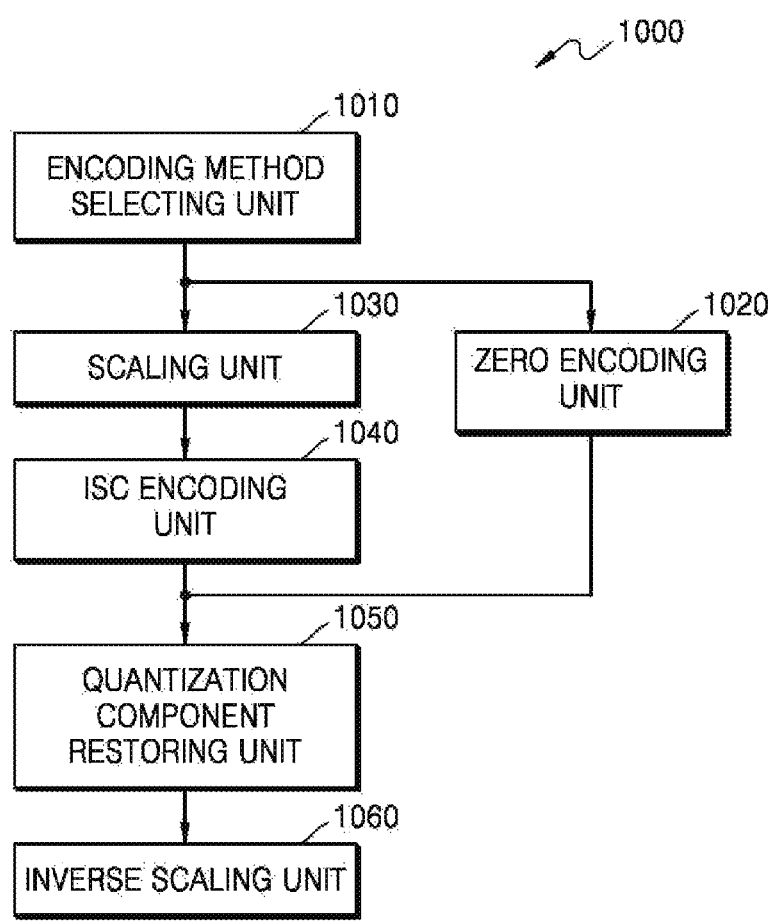
FIG. 10 is a block diagram of a spectrum encoding apparatus according to an exemplary embodiment.

FIG. 10 is a block diagram illustrating a configuration of a spectrum encoding apparatus according to an exemplary embodiment. The apparatus shown in FIG. 10 may correspond to the spectrum quantizing and encoding unit 750 of FIG. 7, may be included in another frequency domain encoding apparatus, or may be independently implemented.

The apparatus shown in FIG. 10 may include an encoding method selecting unit 1010, a zero encoding unit 1020, a scaling unit 1030, an ISC encoding unit 1040, a quantized component restoring unit 1050, and an inverse scaling unit 1060. Herein, the quantized component restoring unit 1050 and the inverse scaling unit 1060 may be optionally provided.

In FIG. 10, the encoding method selection unit 1010 may select an encoding method by taking into account an input signal characteristic. The input signal characteristic may include at least one of a bandwidth and bits allocated for each band. A normalized spectrum may be provided to the zero encoding unit 1020 or the scaling unit 1030 based on an encoding scheme selected for each band. According to an embodiment, in a case that the bandwidth is either the narrow band or the wide band, when the average number of bits allocated to each sample of a band is greater than or equal to a predetermined value, e.g., 0.75, USQ may be used for the corresponding band by determining that the corresponding band is of high importance, and TCQ may be used for all the other bands. Herein, the average number of bits may be determined by taking into account a band length or a band size. The selected encoding method may be set using a one-bit flag. According to another embodiment, in a case that the bandwidth is either a super wide band (SWB) or a full band (FB), a joint USQ and TCQ method may be used.

The zero encoding unit 1020 may encode all samples to zero (0) for bands of which allocated bits are zero.

The scaling unit 1030 may adjust a bit rate by scaling a spectrum based on bits allocated to bands. In this case, a normalized spectrum may be used. The scaling unit 1030 may perform scaling by taking into account the average number of bits allocated to each sample, i.e., a spectral coefficient, included in a band. For example, the greater the average number of bits is, the more scaling may be performed.

According to an embodiment, the scaling unit 1030 may determine an appropriate scaling value according to bit allocation for each band.

In detail, first, the number of pulses for a current band may be estimated using a band length and bit allocation information. Herein, the pulses may indicate unit pulses. Before the estimation, bits (b) actually needed for the current band may be calculated based on Equation 1.

$$b = \log_2\left(\sum_{i=1}^{min(m,n)} 2^i \frac{n!}{(n-i)!i!} \frac{(m-1)!}{(i-1)!(m-1)!}\right) \quad (1)$$

where, n denotes a band length, m denotes the number of pulses, and i denotes the number of non-zero positions having the important spectral component (ISC).

The number of non-zero positions may be obtained based on, for example, a probability by Equation 2.

$$pNZP(i)=2^{i-h}C_n^iC_{m-1}^{i-1}, i \in \{1, \ldots, min(m,n)\} \quad (2)$$

In addition, the number of bits needed for the non-zero positions may be estimated by Equation 3.

$$b_{nzp}=\log_2(pNZP(i)) \quad (3)$$

Finally, the number of pulses may be selected by a value b having the closest value to bits allocated to each band.

Next, an initial scaling factor may be determined by the estimation of the number of pulses obtained for each band and an absolute value of an input signal. The input signal may be scaled by the initial scaling factor. If a sum of the numbers of pulses for a scaled original signal, i.e., a quantized signal, is not the same as the estimated number of pulses, pulse redistribution processing may be performed using an updated scaling factor. According to the pulse redistribution processing, if the number of pulses selected for the current band is less than the estimated number of pulses obtained for each band, the number of pulses increases by decreasing the scaling factor, otherwise if the number of pulses selected for the current band is greater than the estimated number of pulses obtained for each band, the number of pulses decreases by increasing the scaling factor. In this case, the scaling factor may be increased or decreased by a predetermined value by selecting a position where distortion of an original signal is minimized.

Since a distortion function for TSQ requires a relative size rather than an accurate distance, the distortion function for TSQ may be obtained a sum of a squared distance between a quantized value and an un-quantized value in each band as shown in Equation 4.

$$d^2 = \sum_{i=1}^{n} (p_i - q_i)^2 \tag{4}$$

where, $p_i$ denotes an actual value, and qi denotes a quantized value.

A distortion function for USQ may use a Euclidean distance to determine a best quantized value. In this case, a modified equation including a scaling factor may be used to minimize computational complexity, and the distortion function may be calculated by Equation 5.

$$d_1 = \sqrt{\sum_{i=1}^{n} (p_i - g_1 q_i)^2} \tag{5}$$

If the number of pulses for each band dows not match a required value, a predetermined number of pulses may need to be increased or decreased while maintaining a minimal metric. This may be performed in an iterative manner by adding or deleting a single pulse and then repeating until the number of pulses reaches the required value.

To add or delete one pulse, n distortion values need to be obtained to select the most optimum distortion value. For example, a distortion value j may correspond to addition of a pulse to a jth position in a band as shown in Equation 6.

$$d_2^j = \sqrt{\sum_{i=1}^{n} (p_i - g_2 \hat{q}_i)^2}, \, j = 1 \ldots n \tag{6}$$

To avoid Equation 6 from being performed n times, a deviation may be used as shown in Equation 7.

$$d_2^j = \sqrt{\sum_{i=1}^{n} (p_i - g_2 \hat{q}_i)^2} = \tag{7}$$

$$\sum_{i=1}^{n} p_i^2 - 2g_2 \sum_{i=1}^{n} p_i + \sum_{i=1}^{n} \hat{q}_i + g_2^2 \sum_{i=1}^{n} \hat{q}_j^2 = \left\{ \sum_{i=1}^{n} \hat{q}_i = \sum_{i=1}^{n} q_i + 1 \right\},$$

$$\left\{ \sum_{i=1}^{n} \hat{q}_i^2 = \sum_{i \in \{1 \ldots n\}, j \neq 1} q_i^2 + (q_j + 1)^2 = \sum_{i=1}^{n} q_i^2 + 2q_j + 1 \right\} ==$$

$$\sum_{i=1}^{n} p_i^2 - 2g_2 \left( \sum_{i=1}^{n} q_i p_i + p_j \right) + g_2^2 \left( \sum_{i=1}^{n} q_i^2 + 2q_j + 1 \right),$$

$$j = 1, \ldots nn$$

In Equation 7, $$\sum_{i=1}^{q} q_i^2, \sum_{i=1}^{n} q_i p_i, \sum_{i=1}^{n} p_i^2$$

may be calculated just once. In addition, n denotes a band length, i.e., the number of coefficients in a band, p denotes an original signal, i.e., an input signal of a quantizer, q denotes a quantized signal, and g denotes a scaling factor. Finally, a position j where a distortion d is minimized may be selected, thereby updating $q_j$.

To control a bit rate, encoding may be performed by using a scaled spectral coefficient and selecting an appropriate ISC. In detail, a spectral component for quantization may be selected using bit allocation for each band. In this case, the spectral component may be selected based on various combinations according to distribution and variance of spectral components. Next, actual non-zero positions may be calculated. A non-zero position may be obtained by analyzing an amount of scaling and a redistribution operation, and such a selected non-zero position may be referred to as an ISC. In summary, an optimal scaling factor and non-zero position information corresponding to ISCs by analyzing a magnitude of a signal which has undergone a scaling and redistribution process. Herein, the non-zero position information indicates the number and locations of non-zero positions. If the number of pulses is not controlled through the scaling and redistribution process, selected pulses may be quantized through a TCQ process, and surplus bits may be adjusted using a result of the quantization. This process may be illustrated as follows.

For conditions that the number of non-zero positions is not the same as the estimated number of pulses for each band and is greater than a predetermined value, e.g., 1, and quantizer selection information indicates TCQ, surplus bits may be adjusted through actual TCQ quantization. In detail, in a case corresponding to the conditions, a TCQ quantization process is first performed to adjust surplus bits. If the real number of pulses of a current band obtained through the TCQ quantization is smaller than the estimated number of pulses previously obtained for each band, a scaling factor is increased by multiplying a scaling factor determined before the TCQ quantization by a value, e.g., 1.1, greater than 1, otherwise a scaling factor is decreased by multiplying the scaling factor determined before the actual TCQ quantization by a value, e.g., 0.9, less than 1. When the estimated number of pulses obtained for each band is the same as the number of pulses of the current band, which is obtained through the TCQ quantization by repeating this process, surplus bits are updated by calculating bits used in the actual TCQ quantization process. A non-zero position obtained by this process may correspond to an ISC.

The ISC encoding unit 1040 may encode information on the number of finally selected ISCs and information on non-zero positions. In this process, lossless encoding may be applied to enhance encoding efficiency. The ISC encoding unit 1040 may perform encoding using a selected quantizer for a non-zero band of which allocated bits are non zero. In detail, the ISC encoding unit 1040 may select ISCs for each band with respect to a normalized spectrum and encode information about the selected ISCs based on number, position, magnitude, and sign. In this case, an ISC magnitude may be encoded in a manner other than number, position, and sign. For example, the ISC magnitude may be quantized using one of USQ and TCQ and arithmetic-coded, whereas the number, positions, and signs of the ISCs may be arithmetic-coded. According to an embodiment, one of TCQ and USQ may be selected based on a signal characteristic. In addition, a first joint scheme in which a quantizer is selected by additionally performing secondary bit allocation processing on surplus bits from a previously coded band in addition to original bit allocation information for each band may be used. The second bit allocation processing in the first joint method may distribute the surplus bits from the previously coded band and may detect two band that will be encoded separately. Herein, the signal characteristic may include a bit allocated to each band or a band length. For example, if it may be determined that a specific band includes vary important information, USQ may be used. Otherwise, TCQ may be used. If the average number of bits allocated to each sample included in a band is greater than or equal to a threshold value, e.g., 0.75, it may be determined that the corresponding band includes vary important information, and thus USQ may be used. Even in a case of a low band having a short band length, USQ may be used in accordance with circumstances. When the bandwidth of an input signal is an NB or a WB, the first joint scheme may be used. According to another embodiment, the second joint scheme in which all bands may be coded by using USQ and TCQ is used for a least significant bit (LSB). When the bandwidth of an input signal is a SWB or a FB, the second joint scheme may be used.

The quantized component restoring unit 1050 may restore an actual quantized component by adding ISC position, magnitude, and sign information to a quantized component. Herein, zero may be allocated to a spectral coefficient of a zero position, i.e., a spectral coefficient encoded to zero.

The inverse scaling unit 1060 may output a quantized spectral coefficient of the same level as that of a normalized input spectrum by inversely scaling the restored quantized component. The scaling unit 1030 and the inverse scaling unit 1060 may use the same scaling factor.

Figure 11:
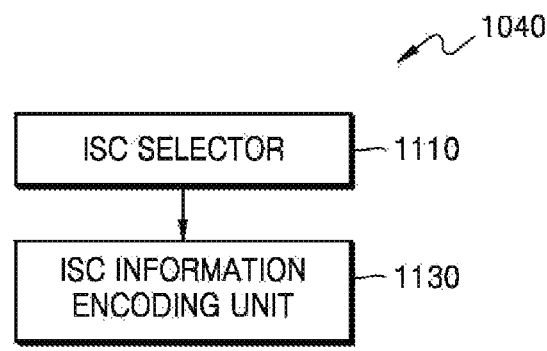
FIG. 11 is a block diagram of an ISC encoding apparatus according to an exemplary embodiment.

FIG. 11 is a block diagram illustrating a configuration of an ISC encoding apparatus according to an exemplary embodiment.

The apparatus shown in FIG. 11 may include an ISC selecting unit 1110 and an ISC information encoding unit 1130. The apparatus of FIG. 11 may correspond to the ISC encoding unit 1040 of FIG. 10 or may be implemented as an independent apparatus.

In FIG. 11, the ISC selecting unit 1110 may select ISCs based on a predetermined criterion from a scaled spectrum to adjust a bit rate. The ISC selecting unit 1110 may obtain actual non-zero positions by analyzing a degree of scaling from the scaled spectrum. Herein, the ISCs may correspond to actual non-zero spectral coefficients before scaling. The ISC selecting unit 1110 may select spectral coefficients to be encoded, i.e., non-zero positions, by taking into account distribution and variance of spectral coefficients based on bits allocated for each band. TCQ may be used for the ISC selection.

The ISC information encoding unit 1130 encode ISC information, i.e., number information, position information, magnitude information, and signs of the ISCs based on the selected ISCs.

Figure 12:
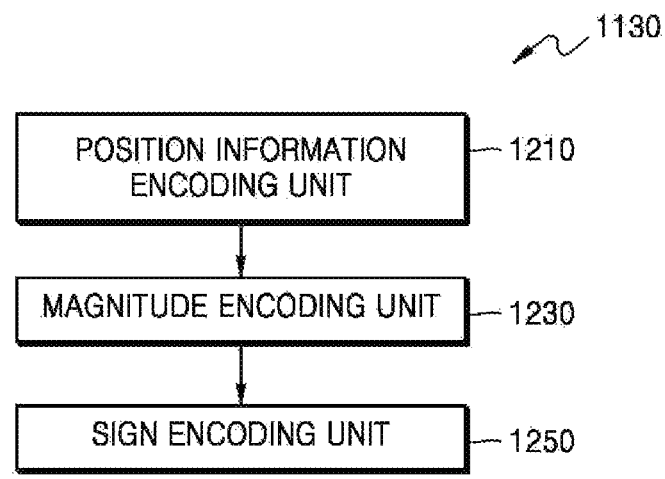
FIG. 12 is a block diagram of an ISC information encoding apparatus according to an exemplary embodiment.

FIG. 12 is a block diagram illustrating a configuration of an ISC information encoding apparatus according to an exemplary embodiment.

The apparatus shown in FIG. 12 may include a position information encoding unit 1210, a magnitude information encoding unit 1230, and a sign encoding unit 1250.

In FIG. 12, the position information encoding unit 1210 may encode position information of the ISCs selected by the ISC selection unit (1110 of FIG. 11), i.e., position information of the non-zero spectral coefficients. The position information may include the number and positions of the selected ISCs. Arithmetic coding may be used for the encoding on the position information. A new buffer may be configured by collecting the selected ISCs. For the ISC collection, zero bands and non-selected spectra may be excluded.

The magnitude information encoding unit 1230 may encode magnitude information of the newly configured ISCs. In this case, quantization may be performed by selecting one of TCQ and USQ, and arithmetic coding may be additionally performed in succession. To increase efficiency of the arithmetic coding, non-zero position information and the number of ISCs may be used.

The sign information encoding unit 1250 may encode sign information of the selected ISCs. Arithmetic coding may be used for the encoding on the sign information.

Figure 13:
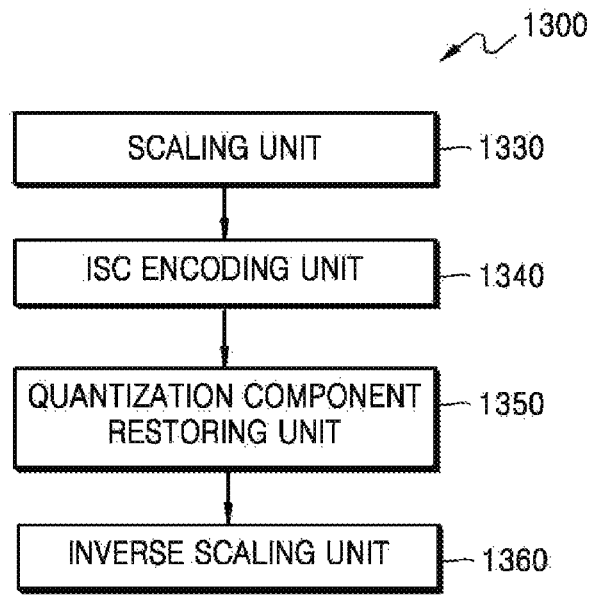
FIG. 13 is a block diagram of a spectrum encoding apparatus according to another exemplary embodiment.

FIG. 13 is a block diagram illustrating a configuration of a spectrum encoding apparatus according to another exemplary embodiment. The apparatus shown in FIG. 13 may correspond to the spectrum quantizing and encoding unit 750 of FIG. 7 or may be included in another frequency domain encoding apparatus or independently implemented.

The apparatus shown in FIG. 13 may include a scaling unit 1330, an ISC encoding unit 1340, a quantized component restoring unit 1350, and an inverse scaling unit 1360. As compared with FIG. 10, an operation of each component is the same except that the zero encoding unit 1020 and the encoding method selection unit 1010 are omitted, and the ISC encoding unit 1340 uses TCQ.

Figure 14:
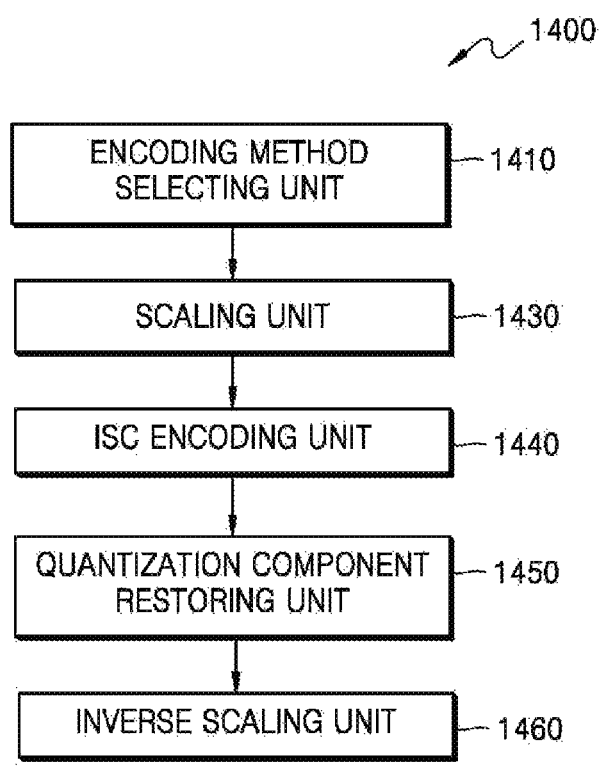
FIG. 14 is a block diagram of a spectrum encoding apparatus according to another exemplary embodiment.

FIG. 14 is a block diagram illustrating a configuration of a spectrum encoding apparatus according to another exemplary embodiment. The apparatus shown in FIG. 14 may correspond to the spectrum quantizing and encoding unit 750 of FIG. 7 or may be included in another frequency domain encoding apparatus or independently implemented.

The apparatus shown in FIG. 14 may include an encoding method selection unit 1410, a scaling unit 1430, an ISC encoding unit 1440, a quantized component restoring unit 1450, and an inverse scaling unit 1460. As compared with FIG. 10, an operation of each component is the same except that the zero encoding unit 1020 is omitted.

Figure 15:
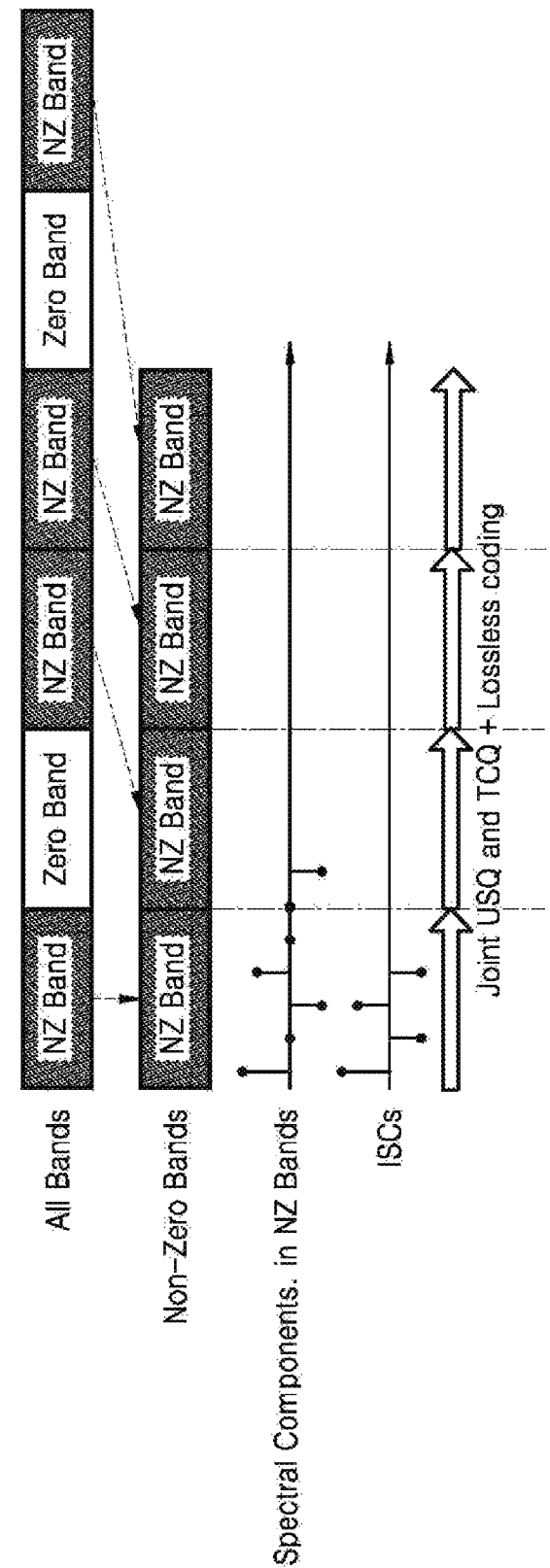
FIG. 15 illustrates a concept of an ISC collection and encoding process according to an exemplary embodiment.

FIG. 15 illustrates a concept of an ISC collecting and encoding process, according to an exemplary embodiment. First, zero bands, i.e., bands to be quantized to zero, are omitted. Next, a new buffer may be configured by using ISCs selected from among spectral components existing in non-zero bands. Quantization may be performed on the newly configured ISCs by using the first or the second joint scheme combining USQ and TCQ, in a band unit and corresponding lossless encoding may be performed.

Figure 16:
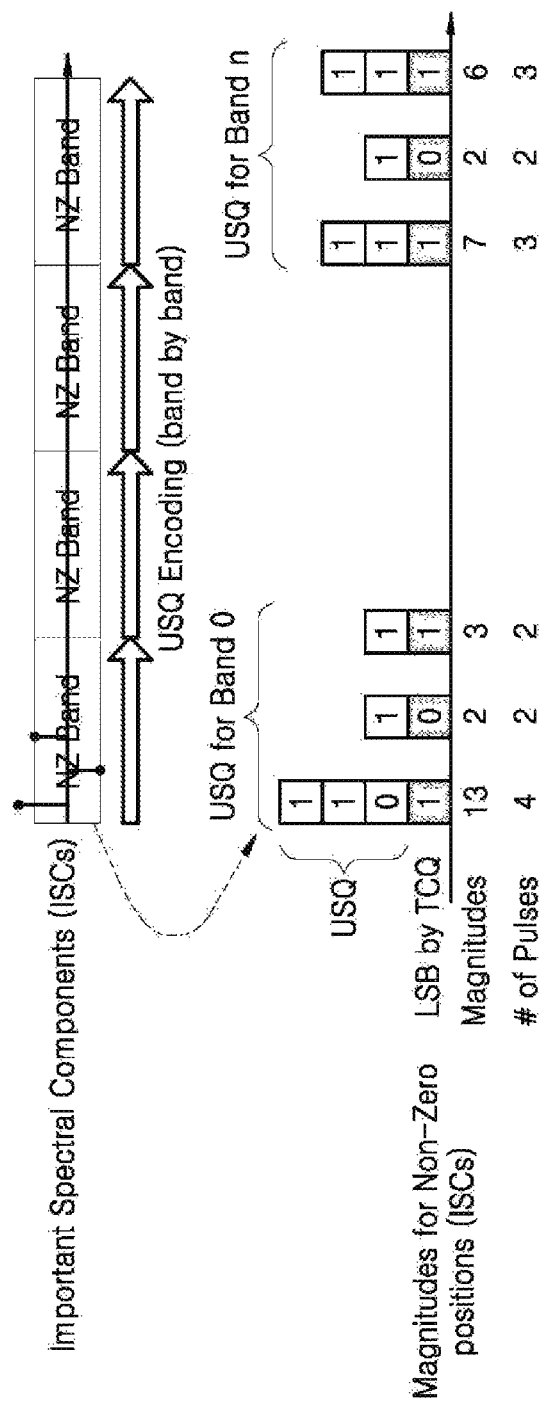
FIG. 16 illustrates a second joint scheme combining USQ and TCQ.

FIG. 16 illustrates a second joint scheme combining USQ and TCQ.

Referring to FIG. 16, quantization may be performed on spectral data in a band unit by using USQ. Each quantized spectral data that is greater than one (1) may contain an LSB which is zero or one. For each band, a sequence of LSBs may be obtained and then be quantized by using TCQ to find the best match between the sequence of LSBs and available trellis paths. In terms of a Signal to Noise Ratio (SNR) criteria, error may occur in the quantized sequence. Instead, at the cost of some errors in the quantized sequence, the length of the sequence may be decreased.

According to the second joint scheme, the advantages of both quantizers, i.e. USQ and TCQ may be used in one scheme and the path limitation may be excluded from TCQ.

Figure 17:
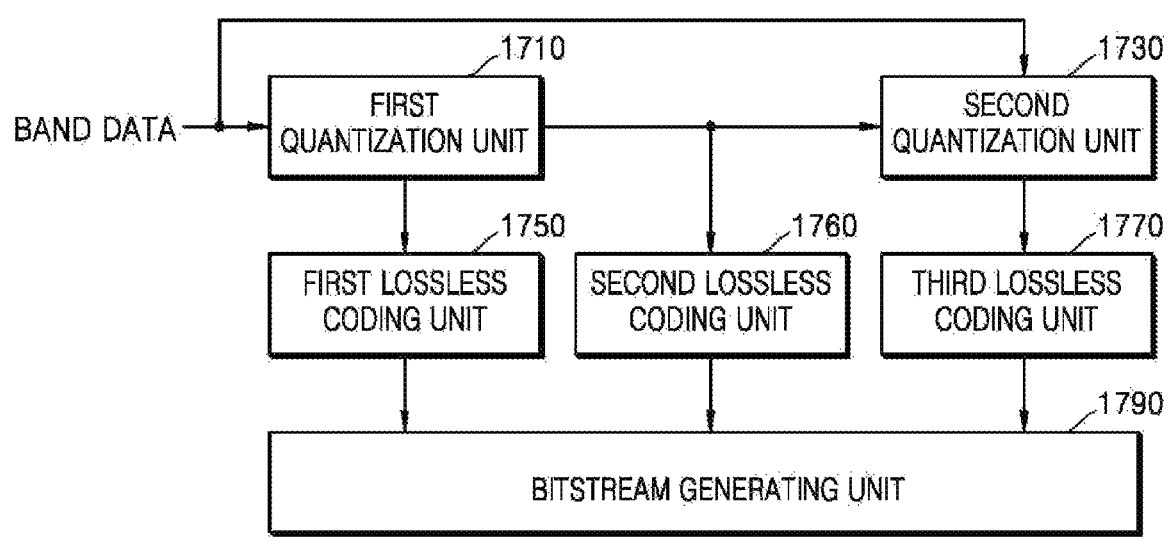
FIG. 17 is a block diagram of a spectrum encoding apparatus according to another exemplary embodiment.

FIG. 17 is a block diagram of a spectrum encoding apparatus according to another exemplary embodiment. The apparatus shown in FIG. 17 may correspond to the ISC encoding unit 1040 of FIG. 10 or independently implemented.

The spectrum encoding apparatus shown in FIG. 17 may include a first quantization unit 1710, a second quantization unit 1730, a first lossless coding unit 1750, a second lossless coding unit 1760, a third lossless coding unit 1770 and a bitstream generating unit 1790. The components may be integrated in at least one processor.

Referring to FIG. 17, the first quantization unit 1710 may quantize spectral data of a band, i.e. a non-zero band by using USQ. The number of bits allocated for quantization of each band may be determined in advance. In this case, the number of bits which will be used for TCQ in the second quantization unit 1730 may be extracted from each non-zero band evenly, and then USQ may be performed on the band by using the remaining number of bits in the non-zero band. The spectral data may be norms or a normalized spectral data.

The second quantization unit 1730 may quantize a lower bit of a quantized spectral data from the first quantization unit 1710, by using TCQ. The lower bit may be an LSB. In this case, for all bands, the lower bit, i.e. residual data may be collected and then TCQ may be performed on the residual data. For all bands that have non-zero data after quantization, residual data may be collected as the difference between the quantized and un-quantized spectral data. If some frequencies are quantized as zero in a non-zero band, they may not be included into residual data. The residual data may construct an array.

The first lossless coding unit 1750 may perform lossless coding on information about ISCs included in a band, e.g. a number, a position and a sign of the ISCs. According to an embodiment, arithmetic coding may be used.

The second lossless coding unit 1760 may perform lossless coding on magnitude information which is constructed by the remaining bit except for the lower bit in the quantized spectral data. According to an embodiment, arithmetic coding may be used.

The third lossless coding unit 1770 may perform lossless coding on TCQ information, i.e. trellis path data obtained from a quantization result of the second quantization unit 1730. According to an embodiment, arithmetic coding may be used. The trellis path data may be encoded as equiprobable symbols. The trellis path data is a binary sequence and may be encoded using an arithmetic encoder with a uniform probability model.

The bitstream generating unit 1790 may generate a bitstream by using data provided from the first to third lossless coding units 1750, 1760 and 1770.

Figure 18:
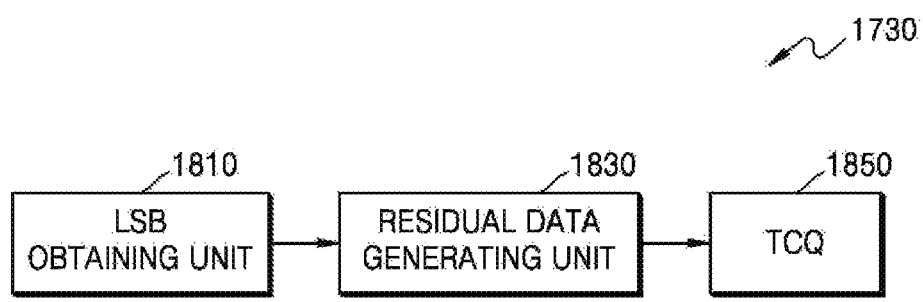
FIG. 18 is a block diagram of a second quantization unit of FIG. 17 according to an exemplary embodiment.

FIG. 18 is a block diagram of a second quantization unit of FIG. 17 according to an exemplary embodiment.

The second quantization unit shown in FIG. 18 may include a lower bit obtaining unit 1810, a residual data generating unit 1830 and a TCQ unit 1850. The components may be integrated in at least one processor.

Referring to FIG. 18, the lower bit obtaining unit 1810 may extract residual data based on the difference between the quantized non-zero spectral data provided from the first quantization unit 1710 and original non-zero spectral data. The residual data may correspond to a lower bit of the quantized non-zero spectral data, e.g. an LSB.

Figure 19:
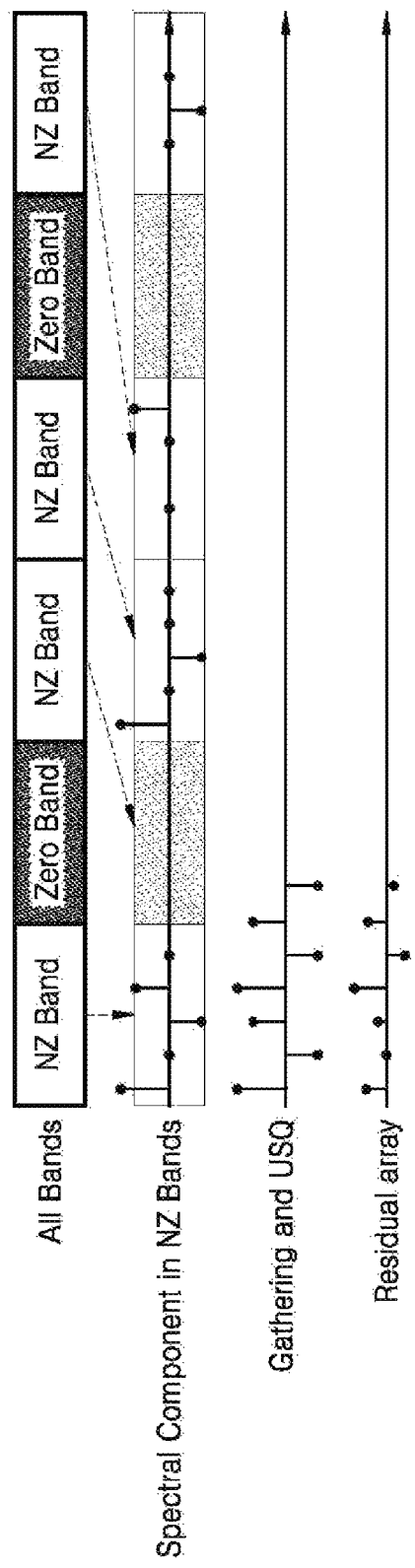
FIG. 19 illustrates a method of generating residual data.

The residual data generating unit 1830 may construct a residual array by collecting the difference between the quantized non-zero spectral data and the original non-zero spectral data for all non-zero bands. FIG. 19 illustrates a method of generating the residual data.

Figure 20:
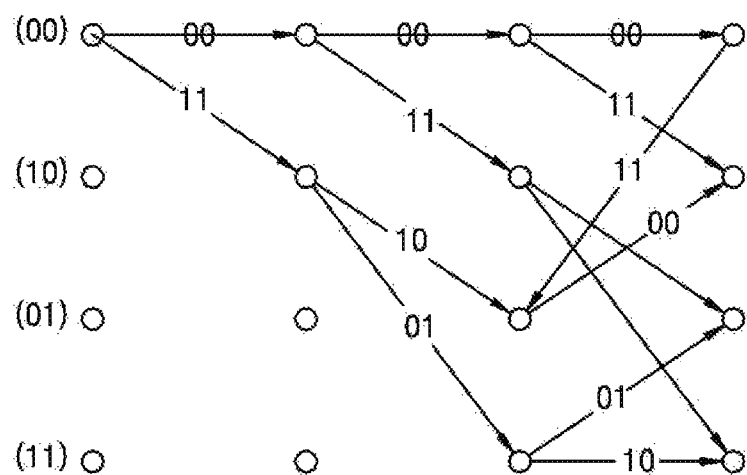
FIG. 20 illustrates an example of TCQ.

The TCQ unit 1850 may perform TCQ on the residual array provided from the residual data generating unit 1830. The residual array may be quantized by TCQ with code rate ½ known $(7,5)_8$ code. FIG. 20 illustrates an example of TCQ having four states. According to an embodiment, quantization using TCQ may be performed for the first 2·TCQ_AMP magnitudes. The constant TCQ_AMP is defined as 10, which allows up to 20 magnitudes per frame to be encoded. After quantization, path metrics may be checked and the best one may be selected. For lossless coding, data for the best trellis path may be stored in a separate array while a trace back procedure is performed.

Figure 21:
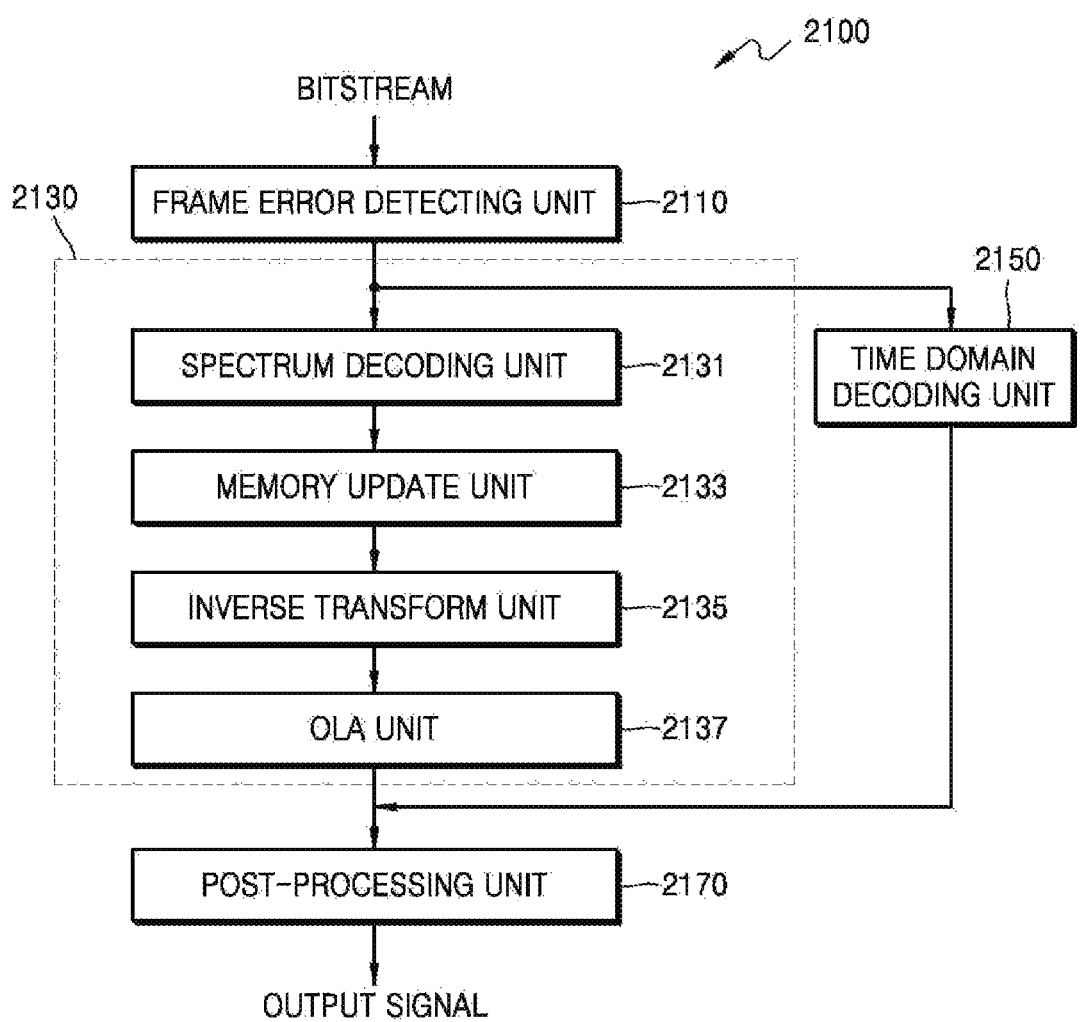
FIG. 21 is a block diagram of a frequency domain audio decoding apparatus according to an exemplary embodiment.

FIG. 21 is a block diagram illustrating a configuration of a frequency domain audio decoding apparatus according to an exemplary embodiment.

A frequency domain audio decoding apparatus 2100 shown in FIG. 21 may include a frame error detecting unit 2110, a frequency domain decoding unit 2130, a time domain decoding unit 2150, and a post-processing unit 2170. The frequency domain decoding unit 2130 may include a spectrum decoding unit 2131, a memory update unit 2133, an inverse transform unit 2135, and an overlap and add (OLA) unit 2137. Each component may be integrated in at least one module and implemented by at least one processor (not shown).

Referring to FIG. 21, the frame error detecting unit 2110 may detect whether a frame error has occurred from a received bitstream.

The frequency domain decoding unit 2130 may operate when an encoding mode is a music mode or a frequency domain mode, enable an FEC or PLC algorithm when a frame error has occurred, and generate a time domain signal through a general transform decoding process when no frame error has occurred. In detail, the spectrum decoding unit 2131 may synthesize a spectral coefficient by performing spectrum decoding using a decoded parameter. The spectrum decoding unit 2131 will be described in more detail with reference FIGS. 19 and 20.

The memory update unit 2133 may update a synthesized spectral coefficient for a current frame that is a normal frame, information obtained using a decoded parameter, the number of continuous error frames till the present, a signal characteristic of each frame, frame type information, or the like for a subsequent frame. Herein, the signal characteristic may include a transient characteristic and a stationary characteristic, and the frame type may include a transient frame, a stationary frame, or a harmonic frame.

The inverse transform unit 2135 may generate a time domain signal by performing time-frequency inverse transform on the synthesized spectral coefficient.

The OLA unit 2137 may perform OLA processing by using a time domain signal of a previous frame, generate a final time domain signal for a current frame as a result of the OLA processing, and provide the final time domain signal to the post-processing unit 2170.

The time domain decoding unit 2150 may operate when the encoding mode is a voice mode or a time domain mode, enable the FEC or PLC algorithm when a frame error has occurred, and generate a time domain signal through a general CELP decoding process when no frame error has occurred.

The post-processing unit 2170 may perform filtering or up-sampling on the time domain signal provided from the frequency domain decoding unit 2130 or the time domain decoding unit 2150 but is not limited thereto. The post-processing unit 2170 may provide a restored audio signal as an output signal.

Figure 22:
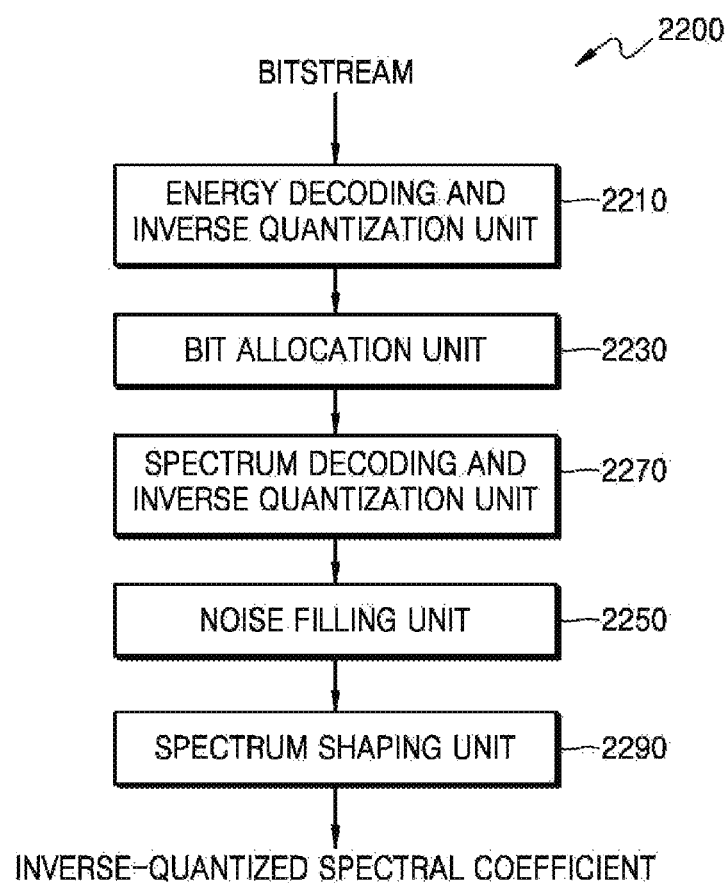
FIG. 22 is a block diagram of a spectrum decoding apparatus according to an exemplary embodiment.

FIG. 22 is a block diagram illustrating a configuration of a spectrum decoding apparatus according to an exemplary embodiment. The apparatus 2200 shown in FIG. 22 may correspond to the spectrum decoding unit 2131 of FIG. 21 or may be included in another frequency domain decoding apparatus or independently implemented.

A spectrum decoding apparatus 2200 shown in FIG. 22 may include an energy decoding and inverse quantizing unit 2210, a bit allocator 2230, a spectrum decoding and inverse quantizing unit 2250, a noise filler 2270, and a spectrum shaping unit 2290. Herein, the noise filler 2270 may be located at a rear end of the spectrum shaping unit 2290. Each component may be integrated in at least one module and implemented by at least one processor (not shown).

Referring to FIG. 22, the energy decoding and inverse quantizing unit 2210 may lossless-decode energy such as a parameter for which lossless encoding has been performed in an encoding process, e.g., a Norm value, and inverse-quantize the decoded Norm value. The inverse quantization may be performed using a scheme corresponding to a quantization scheme for the Norm value in the encoding process.

The bit allocator 2230 may allocate bits of a number required for each sub-band based on a quantized Norm value or the inverse-quantized Norm value. In this case, the number of bits allocated for each sub-band may be the same as the number of bits allocated in the encoding process.

The spectrum decoding and inverse quantizing unit 2250 may generate a normalized spectral coefficient by lossless-decoding an encoded spectral coefficient using the number of bits allocated for each sub-band and performing an inverse quantization process on the decoded spectral coefficient.

The noise filler 2270 may fill noise in portions requiring noise filling for each sub-band among the normalized spectral coefficient.

The spectrum shaping unit 2290 may shape the normalized spectral coefficient by using the inverse-quantized Norm value. A finally decoded spectral coefficient may be obtained through a spectral shaping process.

Figure 23:
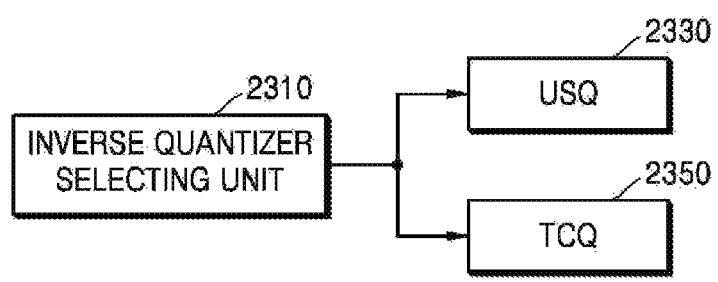
FIG. 23 is a block diagram of a spectrum inverse-quantization apparatus according to an exemplary embodiment.

FIG. 23 is a block diagram illustrating a configuration of a spectrum inverse-quantization apparatus according to an exemplary embodiment.

The apparatus shown in FIG. 23 may include an inverse quantizer selecting unit 2310, a USQ 2330, and a TCQ 2350.

In FIG. 23, the inverse quantizer selecting unit 2310 may select the most efficient inverse quantizer from among various inverse quantizers according to characteristics of an input signal, i.e., a signal to be inverse-quantized. Bit allocation information for each band, band size information, and the like are usable as the characteristics of the input signal. According to a result of the selection, the signal to be inverse-quantized may be provided to one of the USQ 2330 and the TCQ 2350 so that corresponding inverse quantization is performed. FIG. 23 may correspond to the second joint scheme.

Figure 24:
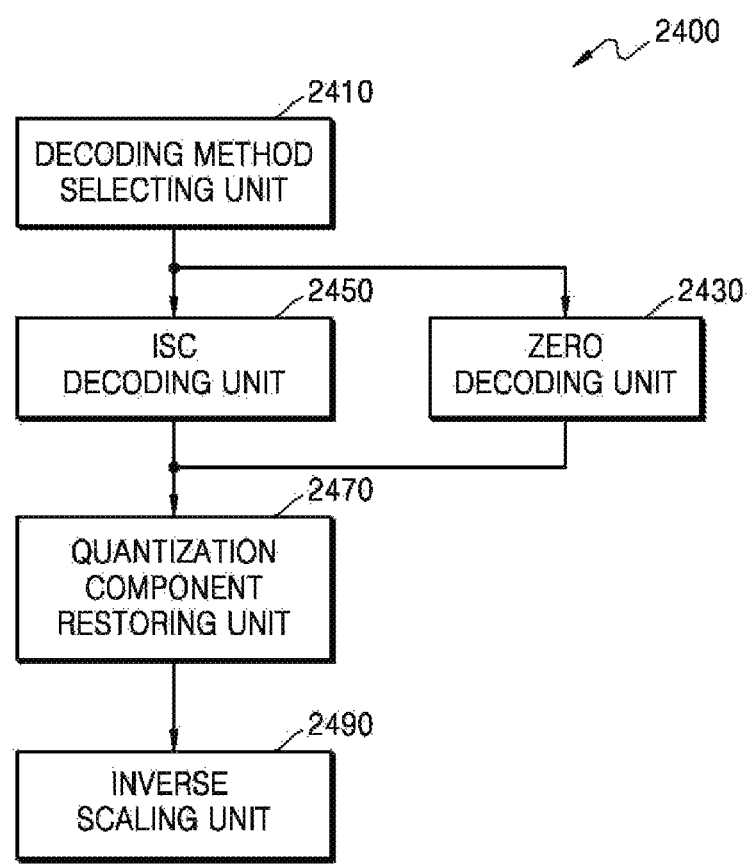
FIG. 24 is a block diagram of a spectrum decoding apparatus according to an exemplary embodiment.

FIG. 24 is a block diagram illustrating a configuration of a spectrum decoding apparatus according to an exemplary embodiment. The apparatus shown in FIG. 24 may correspond to the spectrum decoding and inverse quantizing unit 2250 of FIG. 22 or may be included in another frequency domain decoding apparatus or independently implemented.

The apparatus shown in FIG. 24 may include a decoding method selecting unit 2410, a zero decoding unit 2430, an ISC decoding unit 2450, a quantized component restoring unit 2470, and an inverse scaling unit 2490. Herein, the quantized component restoring unit 2470 and the inverse scaling unit 2490 may be optionally provided.

In FIG. 24, the decoding method selecting unit 2410 may select a decoding method based on bits allocated for each band. A normalized spectrum may be provided to the zero decoding unit 2430 or the ISC decoding unit 2450 based on the decoding method selected for each band.

The zero decoding unit 2430 may decode all samples to zero for bands of which allocated bits are zero.

The ISC decoding unit 2450 may decode bands of which allocated bits are not zero, by using a selected inverse quantizer. The ISC decoding unit 2450 may obtain information about important frequency components for each band of an encoded spectrum and decode the information about the important frequency components obtained for each band, based on number, position, magnitude, and sign. An important frequency component magnitude may be decoded in a manner other than number, position, and sign. For example, the important frequency component magnitude may be arithmetic-decoded and inverse-quantized using one of USQ and TCQ, whereas the number, positions, and signs of the important frequency components may be arithmetic-decoded. The selection of an inverse quantizer may be performed using the same result as in the ISC encoding unit 1040 shown in FIG. 10. The ISC decoding unit 2450 may inverse-quantize the bands of which allocated bits are not zero, based on the first joint scheme or the second joint scheme.

The quantized component restoring unit 2470 may restore actual quantized components based on position, magnitude, and sign information of restored ISCs. Herein, zero may be allocated to zero positions, i.e., non-quantized portions which are spectral coefficients decoded to zero.

The inverse scaling unit (not shown) may be further included to inversely scale the restored quantized components to output quantized spectral coefficients of the same level as the normalized spectrum.

Figure 25:
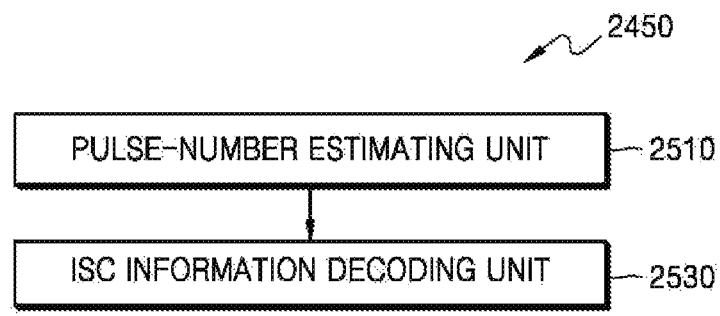
FIG. 25 is a block diagram of an ISO decoding apparatus according to an exemplary embodiment.

FIG. 25 is a block diagram illustrating a configuration of an ISC decoding apparatus according to an exemplary embodiment.

The apparatus shown in FIG. 25 may include a pulse-number estimation unit 2510 and an ISC information decoding unit 2530. The apparatus shown in FIG. 25 may correspond to the ISC decoding unit 2450 of FIG. 24 or may be implemented as an independent apparatus.

In FIG. 25, the pulse-number estimation unit 2510 may determine a estimated value of the number of pulses required for a current band by using a band size and bit allocation information. That is, since bit allocation information of a current frame is the same as that of an encoder, decoding is performed by using the same bit allocation information to derive the same estimated value of the number of pulses.

The ISC information decoding unit 2530 may decode ISC information, i.e., number information, position information, magnitude information, and signs of ISCs based on the estimated number of pulses.

Figure 26:
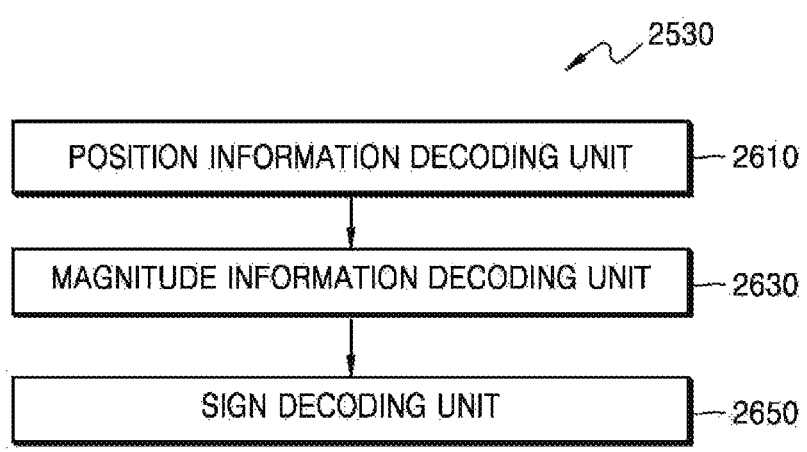
FIG. 26 is a block diagram of an ISO information decoding apparatus according to an exemplary embodiment.

FIG. 26 is a block diagram illustrating a configuration of an ISC information decoding apparatus according to an exemplary embodiment.

The apparatus shown in FIG. 26 may include a position information decoding unit 2610, a magnitude information decoding unit 2630, and a sign decoding unit 2650.

In FIG. 26, the position information decoding unit 2610 may restore the number and positions of ISCs by decoding an index related to position information, which is included in a bitstream. Arithmetic decoding may be used to decode the position information. The magnitude information decoding unit 2330 may arithmetic-decode an index related to magnitude information, which is included in the bitstream and inverse-quantize the decoded index based on the first joint scheme or the second joint scheme. To increase efficiency of the arithmetic decoding, non-zero position information and the number of ISCs may be used. The sign decoding unit 2650 may restore signs of the ISCs by decoding an index related to sign information, which is included in the bitstream. Arithmetic decoding may be used to decode the sign information. According to an embodiment, the number of pulses required for a non-zero band may be estimated and used to decode the position information, the magnitude information, or the sign information.

Figure 27:
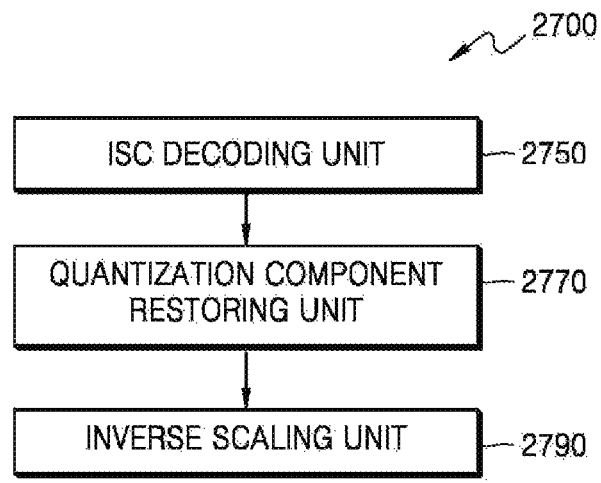
FIG. 27 is a block diagram of a spectrum decoding apparatus according to another exemplary embodiment.

FIG. 27 is a block diagram illustrating a configuration of a spectrum decoding apparatus according to another exemplary embodiment. The apparatus shown in FIG. 27 may correspond to the spectrum decoding and inverse quantizing unit 2250 of FIG. 22 or may be included in another frequency domain decoding apparatus or independently implemented.

The apparatus shown in FIG. 27 may include an ISC decoding unit 2750, a quantized component restoring unit 2770, and an inverse scaling unit 2790. As compared with FIG. 24, an operation of each component is the same except that the decoding method selecting unit 2410 and the zero decoding unit 2430 are omitted, and the ISC decoding unit 2450 uses TCQ.

Figure 28:
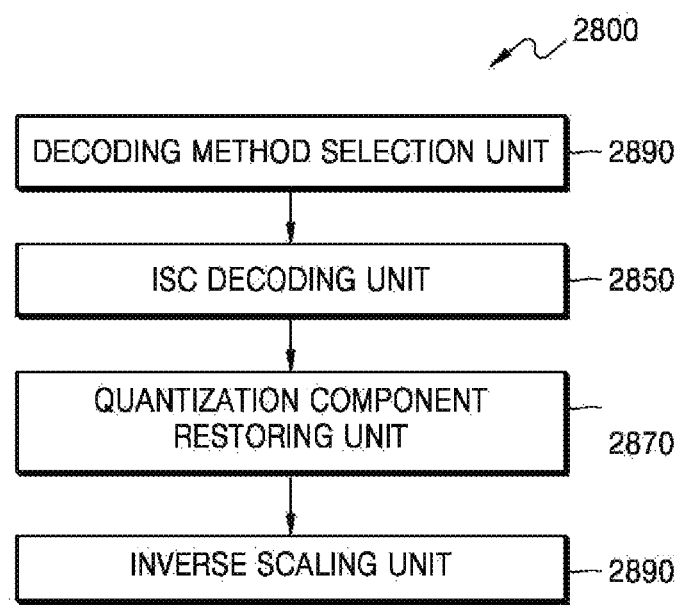
FIG. 28 is a block diagram of a spectrum decoding apparatus according to another exemplary embodiment.

FIG. 28 is a block diagram illustrating a configuration of a spectrum decoding apparatus according to another exemplary embodiment. The apparatus shown in FIG. 28 may correspond to the spectrum decoding and inverse quantizing unit 2250 of FIG. 22 or may be included in another frequency domain decoding apparatus or independently implemented.

The apparatus shown in FIG. 28 may include a decoding method selection unit 2810, an ISC decoding unit 2850, a quantized component restoring unit 2870, and an inverse scaling unit 2890. As compared with FIG. 24, an operation of each component is the same except that the zero decoding unit 2430 is omitted.

Figure 29:
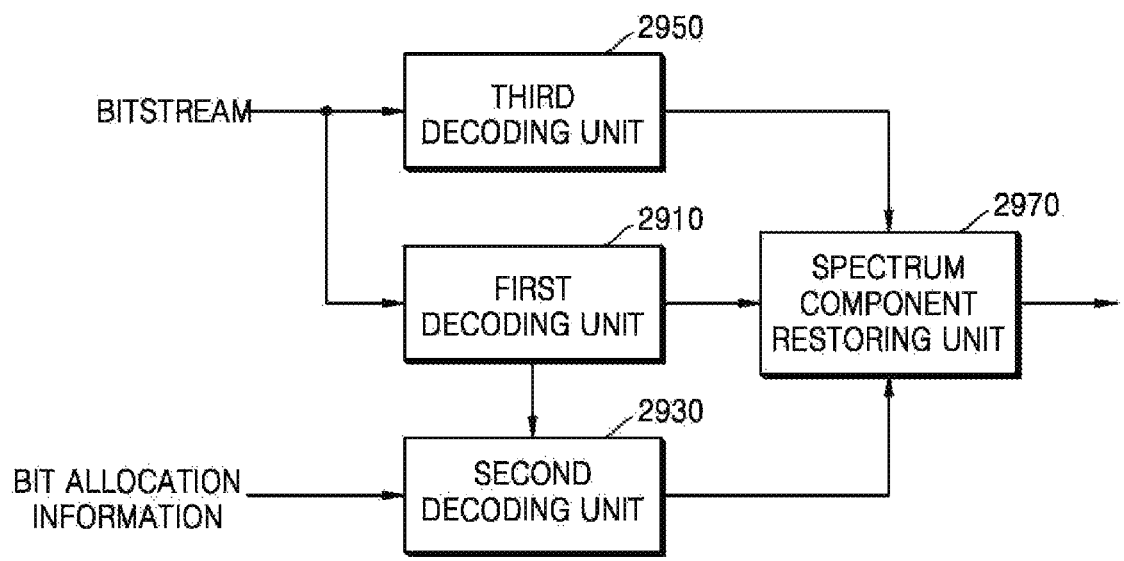
FIG. 29 is a block diagram of a spectrum decoding apparatus according to another exemplary embodiment.

FIG. 29 is a block diagram of a spectrum decoding apparatus according to another exemplary embodiment. The apparatus shown in FIG. 29 may correspond to the ISC decoding unit 2450 of FIG. 24, or may be independently implemented.

The apparatus shown in FIG. 29 may include a first decoding unit 2910, a second decoding unit 2930, a third decoding unit 2950 and a spectrum component restoring unit 2970.

In FIG. 29, the first decoding unit 2910 may extract ISC information of a band from a bitstream and may decode number, position and sign of ISCs. The remaining bits except for a lower bit may be extracted and then be decoded. The decoded ISC information may be provided to the spectrum component restoring unit 2970 and position information of ISCs may be provided to the second decoding unit 2930.

The second decoding unit 2930 may decode the remaining bits except for a lower bit from the spectral data for each band, based on the position information of the decoded ISCs provided from the first decoding unit 2910 and bit allocation of each band. The surplus bits corresponding to a difference between the allocated bits of a band and an actually used bits of the band may be accumulated and then be used for a next band.

The third decoding unit 2950 may restore a TCQ residual array corresponding to the sequence of lower bits by decoding the TCQ path information extracted from the bitstream.

The spectrum component restoring unit 2970 may reconstruct spectrum components based on data provided from the first decoding unit 2910, the second decoding unit 2930 and the third decoding unit 2950.

The first to third decoding units 2910, 2930 and 2950 may use arithmetic decoding for lossless decoding.

Figure 30:
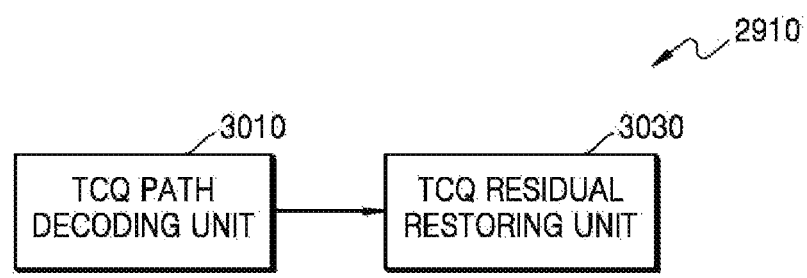
FIG. 30 is a block diagram of a third decoding unit of FIG. 29 according to another exemplary embodiment.

FIG. 30 is a block diagram of a third decoding unit of FIG. 29 according to another exemplary embodiment.

The third decoding unit shown in FIG. 30 may include a TCQ path decoding unit 3010 and a TCQ residual restoring unit 3030.

In FIG. 30, the TCQ path decoding unit 3010 may decode TCQ path information obtained from the bitstream.

The TCQ residual restoring unit 3030 may TCQ residual data based on the decoded TCQ path information. In detail, the residual data, i.e. a residual array may be reconstructed according to a decoded trellis state. From each path bit, two LSB bits may be generated in the residual array. This process may be represented by the following pseudo code.

```
for( state = 0, i = 0; i < bcount; i++)
{
residualbuffer[2*i]   = dec_LSB[state][dpath[i]] & 0x1;
residualbuffer [2*i + 1] = dec_LSB[state][dpath[i]] & 0x2;
state = trellis_nextstate[state][dpath[i]];
}
```

Starting from state 0, the decoder may move through the trellis using decoded dpath bits, and may extract two bits corresponding to the current trellis edge.

The configurations of FIGS. 29 and 30 may have a reversible relationship to the configurations of FIGS. 17 and 18.

Figure 31:
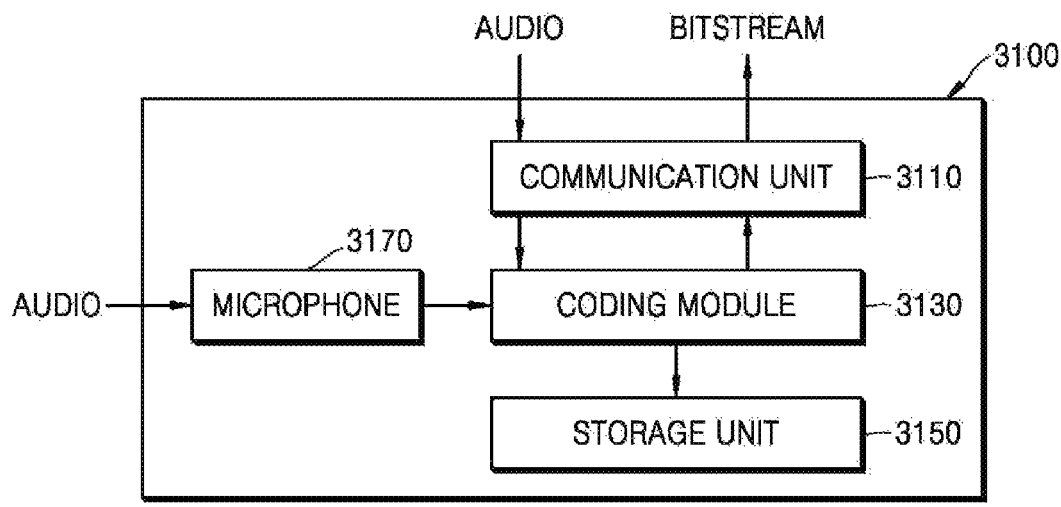
FIG. 31 is a block diagram of a multimedia device according to an exemplary embodiment.

FIG. 31 is a block diagram of a multimedia device including an encoding module, according to an exemplary embodiment.

Referring to FIG. 31, the multimedia device 3100 may include a communication unit 3110 and the encoding module 3130. In addition, the multimedia device 3100 may further include a storage unit 3150 for storing an audio bitstream obtained as a result of encoding according to the usage of the audio bitstream. Moreover, the multimedia device 3100 may further include a microphone 3170. That is, the storage unit 3150 and the microphone 3170 may be optionally included. The multimedia device 3100 may further include an arbitrary decoding module (not shown), e.g., a decoding module for performing a general decoding function or a decoding module according to an exemplary embodiment. The encoding module 3130 may be implemented by at least one processor (not shown) by being integrated with other components (not shown) included in the multimedia device 3100 as one body.

The communication unit 3110 may receive at least one of an audio signal or an encoded bitstream provided from the outside or may transmit at least one of a reconstructed audio signal or an encoded bitstream obtained as a result of encoding in the encoding module 3130.

The communication unit 3110 is configured to transmit and receive data to and from an external multimedia device or a server through a wireless network, such as wireless Internet, wireless intranet, a wireless telephone network, a wireless Local Area Network (LAN), Wi-Fi, Wi-Fi Direct (WFD), third generation (3G), fourth generation (4G), Bluetooth, Infrared Data Association (IrDA), Radio Frequency Identification (RFID), Ultra WideBand (UWB), Zigbee, or Near Field Communication (NFC), or a wired network, such as a wired telephone network or wired Internet.

According to an exemplary embodiment, the encoding module 3130 may quantize spectral data of a current band based on a first quantization scheme, generate a lower bit of the current band using the spectral data and the quantized spectral data, quantize a sequence of lower bits including the lower bit of the current band based on a second quantization scheme, and generate a bitstream based on a upper bit excluding N bits, where N is 1 or greater, from the quantized spectral data and the quantized sequence of lower bits.

The storage unit 3150 may store the encoded bitstream generated by the encoding module 3130. In addition, the storage unit 3150 may store various programs required to operate the multimedia device 3100.

The microphone 3170 may provide an audio signal from a user or the outside to the encoding module 3130.

Figure 32:
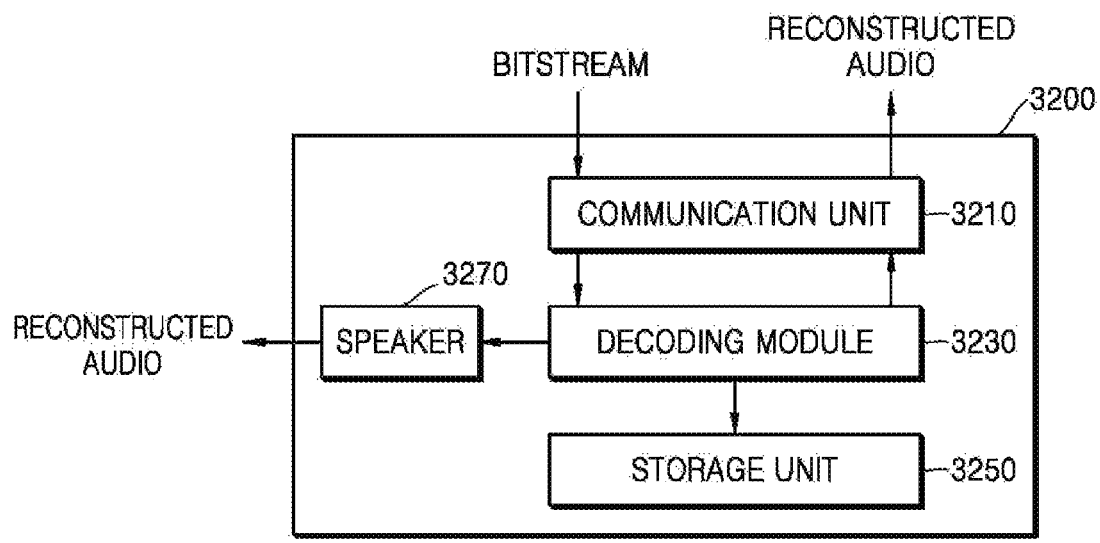
FIG. 32 is a block diagram of a multimedia device according to another exemplary embodiment.

FIG. 32 is a block diagram of a multimedia device including a decoding module, according to an exemplary embodiment.

Referring to FIG. 32, the multimedia device 3200 may include a communication unit 3210 and a decoding module 3230. In addition, according to the usage of a reconstructed audio signal obtained as a result of decoding, the multimedia device 3200 may further include a storage unit 3250 for storing the reconstructed audio signal. In addition, the multimedia device 3200 may further include a speaker 3270. That is, the storage unit 3250 and the speaker 3270 may be optionally included. The multimedia device 3200 may further include an encoding module (not shown), e.g., an encoding module for performing a general encoding function or an encoding module according to an exemplary embodiment. The decoding module 3230 may be implemented by at least one processor (not shown) by being integrated with other components (not shown) included in the multimedia device 3200 as one body.

The communication unit 3290 may receive at least one of an audio signal or an encoded bitstream provided from the outside or may transmit at least one of a reconstructed audio signal obtained as a result of decoding in the decoding module 3230 or an audio bitstream obtained as a result of encoding. The communication unit 3210 may be implemented substantially and similarly to the communication unit 3100 of FIG. 31.

According to an exemplary embodiment, the decoding module 3230 may receive a bitstream provided via the communication unit 3210, decode a sequence of lower bits by extracting TCQ path information, decode number, position and sign of ISCs by extracting ISC information, extract and decode a remaining bit except for a lower bit, and reconstruct spectrum components based on the decoded sequence of lower bits and the decoded remaining bit except for the lower bit.

The storage unit 3250 may store the reconstructed audio signal generated by the decoding module 3230. In addition, the storage unit 3250 may store various programs required to operate the multimedia device 3200.

The speaker 3270 may output the reconstructed audio signal generated by the decoding module 3230 to the outside.

Figure 33:
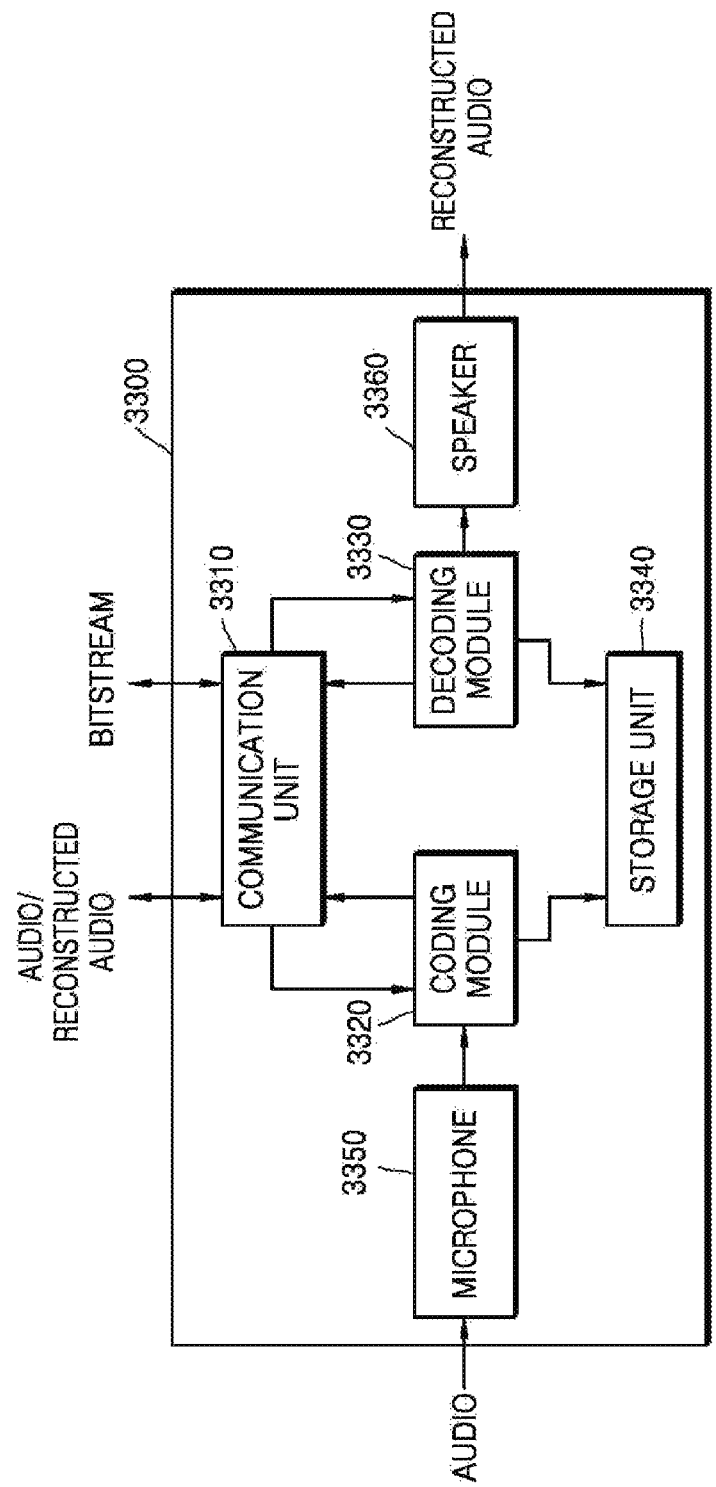
FIG. 33 is a block diagram of a multimedia device according to another exemplary embodiment.

FIG. 33 is a block diagram of a multimedia device including an encoding module and a decoding module, according to an exemplary embodiment.

Referring to FIG. 33, the multimedia device 3300 may include a communication unit 3310, an encoding module 3320, and a decoding module 3330. In addition, the multimedia device 3300 may further include a storage unit 3340 for storing an audio bitstream obtained as a result of encoding or a reconstructed audio signal obtained as a result of decoding according to the usage of the audio bitstream or the reconstructed audio signal. In addition, the multimedia device 3300 may further include a microphone 3350 and/or a speaker 3360. The encoding module 3320 and the decoding module 3330 may be implemented by at least one processor (not shown) by being integrated with other components (not shown) included in the multimedia device 3300 as one body.

Since the components of the multimedia device 3300 shown in FIG. 33 correspond to the components of the multimedia device 3100 shown in FIG. 31 or the components of the multimedia device 3200 shown in FIG. 32, a detailed description thereof is omitted.

Each of the multimedia devices 3100, 3200, and 3300 shown in FIGS. 31, 32, and 33 may include a voice communication dedicated terminal, such as a telephone or a mobile phone, a broadcasting or music dedicated device, such as a TV or an MP3 player, or a hybrid terminal device of a voice communication dedicated terminal and a broadcasting or music dedicated device but are not limited thereto. In addition, each of the multimedia devices 3100, 3200, and 3300 may be used as a client, a server, or a transducer displaced between a client and a server.

When the multimedia device 3100, 3200, and 3300 is, for example, a mobile phone, although not shown, the multimedia device 3100, 3200, and 3300 may further include a user input unit, such as a keypad, a display unit for displaying information processed by a user interface or the mobile phone, and a processor for controlling the functions of the mobile phone. In addition, the mobile phone may further include a camera unit having an image pickup function and at least one component for performing a function required for the mobile phone.

When the multimedia device 3100, 3200, and 3300 is, for example, a TV, although not shown, the multimedia device 3100, 3200, or 3300 may further include a user input unit, such as a keypad, a display unit for displaying received broadcasting information, and a processor for controlling all functions of the TV. In addition, the TV may further include at least one component for performing a function of the TV.

Figure 34:
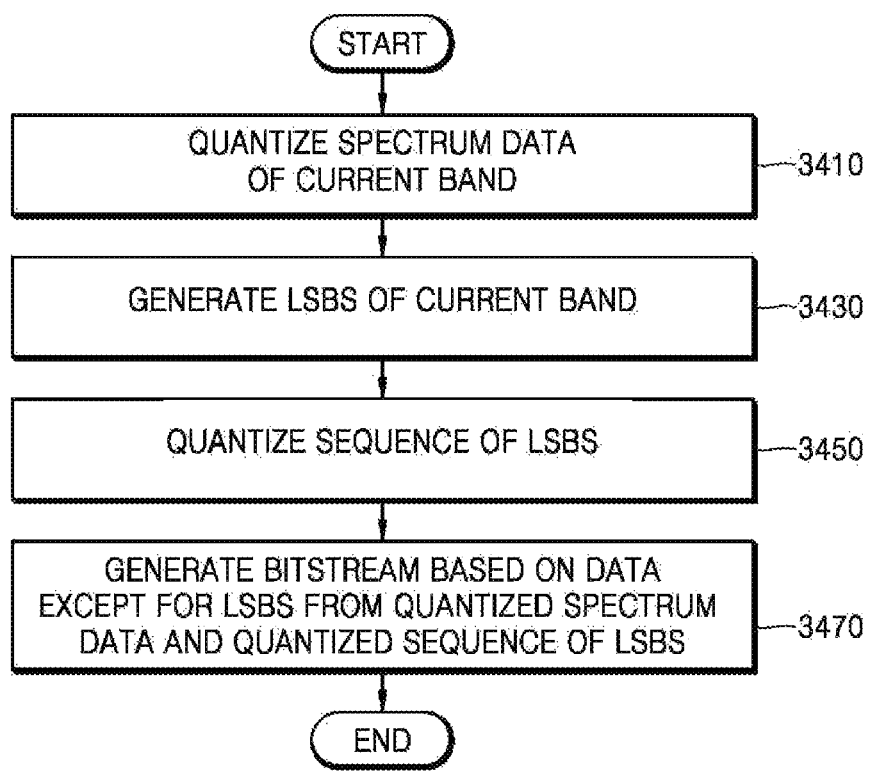
FIG. 34 is a flowchart illustrating a spectrum encoding method according to an exemplary embodiment.

FIG. 34 is a flowchart illustrating a spectrum encoding method according to an exemplary embodiment.

Referring to FIG. 34, in operation 3410, spectral data of a current band may be quantized by using a first quantization scheme. The first quantization scheme may be a scalar quantizer. As an example, the USQ having a uniform quantization step size may be used.

In operation 3430, a lower bit of the current band may be generated based on the spectral data and the quantized spectral data. The lower bit may be obtained based on a difference between the spectral data and the quantized spectral data. The second quantization scheme may be the TCQ.

In operation 3450, a sequence of the lower bits including the lower bit of the current band may be quantized by using the second quantization scheme.

In operation 3470, a bitstream may be generated based on upper bits except for N bit, where N is a value greater than or equal to 1) from the quantized spectral data and the quantized sequence of the lower bits.

The bandwidth of spectral data related to a spectrum encoding method of FIG. 34 may be a SWB or a FB. In addition, the spectral data may be obtained by performing MDCT on an input audio signal and may be coding in a normal mode.

Some functions in respective components of the above encoding apparatus may be added into respective operations of FIG. 34, according to circumstances or user's need.

Figure 35:
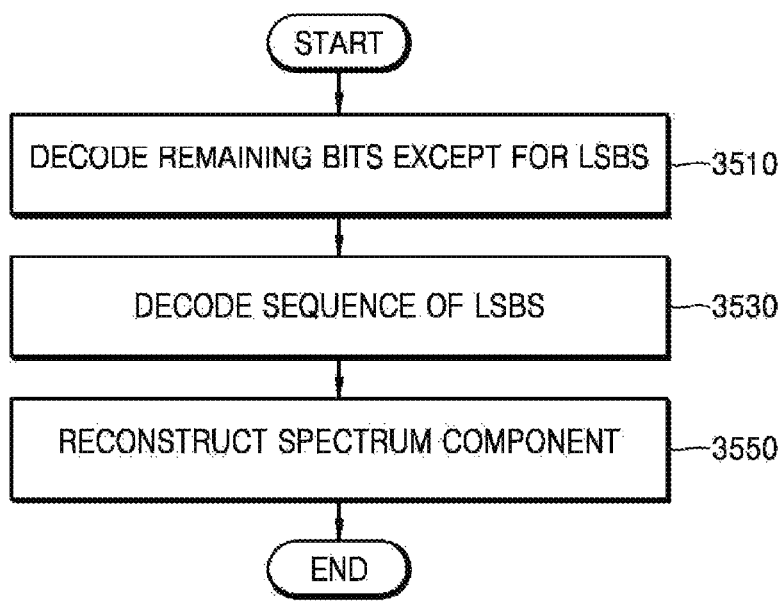
FIG. 35 is a flowchart illustrating a spectrum decoding method according to an exemplary embodiment.

FIG. 35 is a flowchart illustrating a spectrum decoding method according to an exemplary embodiment.

Referring to FIG. 35, in 3510, ISC information may be extracted from a bitstream and number, position and sign of ISCs may be decoded. The remaining bits except for a lower bit may be extracted and then be decoded.

In operation 3530, the sequence of the lower bits may be decoded by extracting TCQ path information from the bitstream.

In operation 3550, spectral components may be reconstructed based on the decoded remaining bits except for the lower bit by operation 3510 and the decoded sequence of the lower bits by operation 3530.

Some functions in respective components of the above decoding apparatus may be added into respective operations of FIG. 35, according to circumstances or user's need.

Figure 36:
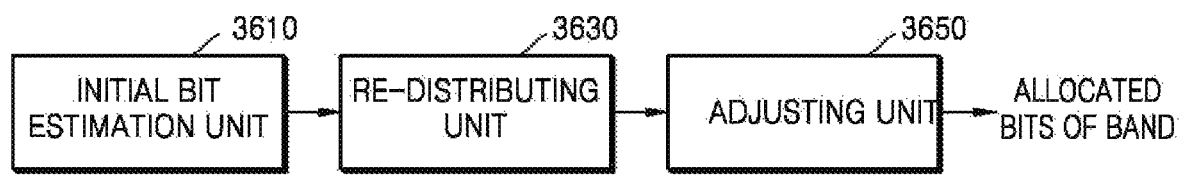
FIG. 36 is a block diagram of a bit allocation apparatus according to an exemplary embodiment.

FIG. 36 is a block diagram of a bit allocation apparatus according to an exemplary embodiment. The apparatus shown in FIG. 36 may correspond to the bit allocator 516 of FIG. 5, the bit allocator 730 of FIG. 7 or the bit allocation unit 2230 of FIG. 22, or may be independently implemented.

A bit allocation apparatus shown in FIG. 36 may include a bit estimation unit 3610, a re-distributing unit 3630 and an adjusting unit 3650, which may be integrated into at least one processor. For bit allocation used in spectrum quantization, fractional bit allocation may be used. According to the fractional bit allocation, bit allocation with the fractional parts of e.g. 3 bits may be permitted and thus it is possible to perform a finer bit allocation. In a generic mode, the fractional bit allocation may be used.

In FIG. 36, the bit estimation unit 3610 may estimate initially allocated bits for each band based on average energy of a band, e.g. norms.

The initially allocated bits $R_0(p,0)$ of a band may be estimated by Equation 8.

$$R_0(p, 0) = \max\left\{0, \frac{L_M(p)}{3} * \left(\hat{I}_M(i) - \frac{\sum_{i=0}^{N_{bands}-1} L_M(i) * \hat{I}_M(i) - 3*TB}{\sum_{i=0}^{N_{bands}-1} L_M(i)}\right)\right\} \quad (8)$$

for $p = 0, 1, \ldots, N_{bands} - 1$ where $L_M(p)$ indicates the number of bits that corresponds to 1 bit/sample in a band p, and if a band includes 10 samples, $L_M(p)$ becomes 10 bits. TB is a total bit budget and $\hat{I}_M(i)$ indicates quantized norms of a band i.

The re-distributing unit 3630 may re-distribute the initially allocated bits of each band, based on a predetermined criteria.

The fully allocated bits may be calculated as a starting point and the first-stage iterations may be done to re-distribute the allocated bits to the bands with non-zero bits until the number of fully allocated bits is equal to the total bit budget TB, which is represented by Equation 9.

$$R_0(p, k) = \max\left\{0, R_0(p, k-1) - L_M(p) * \frac{\sum_{i=0}^{N_{bands}-1} R_0(p, k-1) - TB}{NSL_0(k-1)}\right\} \quad (9)$$

where $NSL_0(k-1)$ is the number of spectral lines in all bands with allocated bits after k iterations.

If too few bits are allocated, this can cause a quality degradation due to the reduced SNR. To avoid this problem, a minimum bit limitation may be applied to the allocated bits. The first minimum bit may consist of constant values depending on the band index and bit-rate. As an example, the first minimum bit LNB(p) may be determined as 3 for a band p=0 to 15, 4 for a band p=16 to 23, and 5 for a band p=24 to $N_{bands}-1$.

In the second-stage iterations, the re-distribution of bits may be done again to allocate bits to the bands with more than $L_M(p)$ bits. The value of $L_M(p)$ bits may correspond to the second minimum bits required for each band.

Initially, the allocated bits $R_1(p,0)$ may be calculated based on the result of the first-stage iteration and the first and second minimum bit for each band, which is represented by Equation 10, as an example.

$$R_1(p, 0) = \begin{cases} 0 & \text{if } R(p) < bs + LNB(p) \\ L_M(p) & \text{if } bs + LNB(p) \le R(p) <= L_M(p) \end{cases} \quad (10)$$

for $p = 0, \ldots, N_{bands} - 1$ where R(p) is the allocated bits after the first-stage iterations, and bs is 2 at 24.4 kbps and 3 at 32 kbps, but is not limited thereto.

TB may be updated by subtracting the number of bits in bands with $L_M(p)$ bits, and the band index p may be updated to p' which indicates the band indices with higher bits than $L_M(p)$ bits. $N_{bands}$ may also be updated to $N'_{bands}$ which is the number of bands for p'.

The second-stage iterations may be then done until the updated TB (TB') is equal to the number of bits in bands with more than $L_M(p')$ bits, which is represented by Equation 11, as an example.

$$R_1(p', k) = \max\left\{L_M(p'), R_1(p', k-1) - L_M(p') * \frac{\sum_{i=0}^{N_{bands}-1} R_1(p', k-1) - TB'}{NSL_1(k-1)}\right\} \quad (11)$$

where $NSL_1(k-1)$ denotes the number of spectral lines in all bands with more than $L_M(p')$ bits after k iterations.

During the second-stage iterations, if there are no bands with more than $L_M(p')$ bits, the bits in bands with non-zero allocated bits from the highest bands may be set to zero until TB' is equal to zero.

Then, a final re-distribution of over-allocated bits and under-allocated bits may be performed. In this case, the final re-distribution may be performed based on a predetermined reference value.

The adjusting unit 3650 may adjust the fractional parts of the bit allocation result to be a predetermined bit. As an example, the fractional parts of the bit allocation result may be adjusted to have three bits, which may be represented by Equations 12.

$$R(p) \lfloor R(p)*8 \rfloor / 8 \text{ for } p=0, \ldots, N_{bands}-1 \qquad (12)$$

Figure 37:
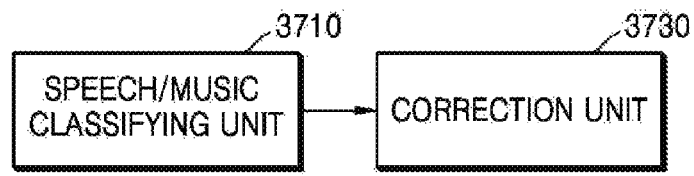
FIG. 37 is a block diagram of a coding mode determination apparatus according to an exemplary embodiment.

FIG. 37 is a block diagram of a coding mode determination apparatus according to an exemplary embodiment.

A coding mode determination apparatus shown in FIG. 37 may include a speech/music classifying unit 3710 and a correction unit 3730. The apparatus shown in FIG. 37 may be included in the mode determiner 213 of FIG. 2A, the mode determiner 314 of FIG. 3A or the mode determiner 413 of FIG. 4A. Also, the apparatus shown in FIG. 37 may be further included in the time domain coder 215 of FIG. 2A, the time domain excitation coder 316 of FIG. 3A or the time domain excitation coder 417 of FIG. 4A, or may be independently implemented. Herein, the components may be integrated into at least one module and implemented as at least one processor (not shown) except for a case where it is needed to be implemented to separate pieces of hardware. In addition, an audio signal may indicate a music signal, a speech signal, or a mixed signal of music and speech.

Referring to FIG. 37, the speech/music classifying unit 3710 may classify whether an audio signal corresponds to a music signal or a speech signal, based on various initial classification parameters. An audio signal classification process may include at least one operation.

According to an embodiment, the audio signal may be classified as a music signal or a speech signal based on signal characteristics of a current frame and a plurality of previous frames. The signal characteristics may include at least one of a short-term characteristic and a long-term characteristic. In addition, the signal characteristics may include at least one of a time domain characteristic and a frequency domain characteristic. Herein, if the audio signal is classified as a speech signal, the audio signal may be coded using a code excited linear prediction (CELP)-type coder. If the audio signal is classified as a music signal, the audio signal may be coded using a transform coder. The transform coder may be, for example, a modified discrete cosine transform (MDCT) coder but is not limited thereto.

According to another exemplary embodiment, an audio signal classification process may include a first operation of classifying an audio signal as a speech signal and a generic audio signal, i.e., a music signal, according to whether the audio signal has a speech characteristic and a second operation of determining whether the generic audio signal is suitable for a generic signal audio coder (GSC). Whether the audio signal can be classified as a speech signal or a music signal may be determined by combining a classification result of the first operation and a classification result of the second operation. When the audio signal is classified as a speech signal, the audio signal may be encoded by a CELP-type coder. The CELP-type coder may include a plurality of modes among an unvoiced coding (UC) mode, a voiced coding (VC) mode, a transient coding (TC) mode, and a generic coding (GC) mode according to a bit rate or a signal characteristic. A generic signal audio coding (GSC) mode may be implemented by a separate coder or included as one mode of the CELP-type coder. When the audio signal is classified as a music signal, the audio signal may be encoded using the transform coder or a CELP/transform hybrid coder. In detail, the transform coder may be applied to a music signal, and the CELP/transform hybrid coder may be applied to a non-music signal, which is not a speech signal, or a signal in which music and speech are mixed. According to an embodiment, according to bandwidths, all of the CELP-type coder, the CELP/transform hybrid coder, and the transform coder may be used, or the CELP-type coder and the transform coder may be used. For example, the CELP-type coder and the transform coder may be used for a narrow-band (NB), and the CELP-type coder, the CELP/transform hybrid coder, and the transform coder may be used for a wide-band (WB), a super-wide-band (SWB), and a full band (FB). The CELP/transform hybrid coder is obtained by combining an LP-based coder which operates in a time domain and a transform domain coder, and may be also referred to as a generic signal audio coder (GSC).

The signal classification of the first operation may be based on a Gaussian mixture model (GMM). Various signal characteristics may be used for the GMM. Examples of the signal characteristics may include open-loop pitch, normalized correlation, spectral envelope, tonal stability, signal's non-stationarity, LP residual error, spectral difference value, and spectral stationarity but are not limited thereto. Examples of signal characteristics used for the signal classification of the second operation may include spectral energy variation characteristic, tilt characteristic of LP analysis residual energy, high-band spectral peakiness characteristic, correlation characteristic, voicing characteristic, and tonal characteristic but are not limited thereto. The characteristics used for the first operation may be used to determine whether the audio signal has a speech characteristic or a non-speech characteristic in order to determine whether the CELP-type coder is suitable for encoding, and the characteristics used for the second operation may be used to determine whether the audio signal has a music characteristic or a non-music characteristic in order to determine whether the GSC is suitable for encoding. For example, one set of frames classified as a music signal in the first operation may be changed to a speech signal in the second operation and then encoded by one of the CELP modes. That is, when the audio signal is a signal of large correlation or an attack signal while having a large pitch period and high stability, the audio signal may be changed from a music signal to a speech signal in the second operation. A coding mode may be changed according to a result of the signal classification described above.

The correction unit 3730 may correct the classification result of the speech/music classifying unit 3710 based on at least one correction parameter. The correction unit 3730 may correct the classification result of the speech/music classifying unit 3710 based on a context. For example, when a current frame is classified as a speech signal, the current frame may be corrected to a music signal or maintained as the speech signal, and when the current frame is classified as a music signal, the current frame may be corrected to a speech signal or maintained as the music signal. To determine whether there is an error in a classification result of the current frame, characteristics of a plurality of frames including the current frame may be used. For example, eight frames may be used, but the embodiment is not limited thereto.

The correction parameter may include a combination of at least one of characteristics such as tonality, linear prediction error, voicing, and correlation. Herein, the tonality may include tonality ton2 of a range of 1-2 KHz and tonality ton3 of a range of 2-4 KHz, which may be defined by Equations 13 and 14, respectively.

$$ton_2 = 0.2 * \log_{10}\left[\sqrt{\frac{1}{8}\sum_{i=0}^{7} \{tonality\ 2^{[-i]}\}^2}\right] \tag{13}$$

$$ton_3 = 0.2 * \log_{10}\left[\sqrt{\frac{1}{8}\sum_{i=0}^{7} \{tonality\ 3^{[-i]}\}^2}\right] \tag{14}$$

where a superscript [−j] denotes a previous frame. For example, tonality2$^{[-1]}$ denotes tonality of a range of 1-2 KHz of a one-frame previous frame.

Low-band long-term tonality $ton_{LT}$ may be defined as $ton_{LT}=0.2*\log_{10}[lt\_tonality]$. Herein, lt_tonality may denote full-band long-term tonality.

A difference $d_{ft}$ between tonality ton2 of a range of 1-2 KHz and tonality ton3 of a range of 2-4 KHz in an nth frame may be defined as $d_{ft}=0.2*\{\log_{10}(tonality2(n))-\log_{10}(tonality3(n))\}$.

Next, a linear prediction error $LP_{err}$ may be defined by Equation 15.

$$LP_{err} = \sqrt{\frac{1}{8}\sum_{i=0}^{7}[FV_s^{[-i]}(9)]^2} \tag{15}$$

where $FV_s(9)$ is defined as $FV_s(i)=sfa_iFV_i+sfb_i$ (i=0, ..., 11) and corresponds to a value obtained by scaling an LP residual log-energy ratio feature parameter defined by Equation 16 among feature parameters used for the speech/music classifying unit 3710. In addition, $sfa_i$ and $sfb_i$ may vary according to types of feature parameters and bandwidths and are used to approximate each feature parameter to a range of [0;1].

$$FV_9 = \log\left(\frac{E(13)}{E(1)}\right) + \log\left(\frac{E^{[-1]}(13)}{E^{[-1]}(1)}\right) \tag{16}$$

where E(1) denotes energy of a first LP coefficient, and E(13) denotes energy of a 13th LP coefficient.

Next, a difference $d_{vcor}$ between a value $FV_s(1)$ obtained by scaling a normalized correlation feature or a voicing feature $FV_1$, which is defined by Equation 17 among the feature parameters used for the speech/music classifying unit 3710, based on $FV_s(i)=sfa_iFV_i+sfb_i$ (i=0, ..., 11) and a value $FV_s(7)$ obtained by scaling a correlation map feature FV(7), which is defined by Equation 18, based on $FV_s(i)=sfa_iFV_i+sfb_i$ (i=0, ..., 11) may be defined as $d_{vcor}=\max(FV_s(1)-FV_s(7),0)$.

$$FV_1 = C_{norm}^{[\cdot]} \tag{17}$$

where $C_{norm}^{[\cdot]}$ denotes a normalized correlation in a first or second half frame.

$$FV_7 = \sum_{j=0}^{127} M_{cor}(j) + \sum_{j=0}^{127} M_{cor}^{[-1]}(j) \tag{18}$$

where $M_{cor}$ denotes a correlation map of a frame.

A correction parameter including at least one of conditions 1 through 4 may be generated using the plurality of feature parameters, taken alone or in combination. Herein, the conditions 1 and 2 may indicate conditions by which a speech state SPEECH_STATE can be changed, and the conditions 3 and 4 may indicate conditions by which a music state MUSIC_STATE can be changed. In detail, the condition 1 enables the speech state SPEECH_STATE to be changed from 0 to 1, and the condition 2 enables the speech state SPEECH_STATE to be changed from 1 to 0. In addition, the condition 3 enables the music state MUSIC_STATE to be changed from 0 to 1, and the condition 4 enables the music state MUSIC_STATE to be changed from 1 to 0. The speech state SPEECH_STATE of 1 may indicate that a speech probability is high, that is, CELP-type coding is suitable, and the speech state SPEECH_STATE of 0 may indicate that non-speech probability is high. As an example, the music state MUSIC_STATE of 1 may indicate that transform coding is suitable, and the music state MUSIC_STATE of 0 may indicate that CELP/transform hybrid coding, i.e., GSC, is suitable. As another example, the music state MUSIC_STATE of 1 may indicate that transform coding is suitable, and the music state MUSIC_STATE of 0 may indicate that CELP-type coding is suitable.

The condition 1 ($cond_A$) may be defined, for example, as follows. That is, when $d_{vcor}>0.4$ AND $d_{ft}<0.1$ AND $FV_s(1)>(2*FV_s(7)+0.12)$ AND $ton_2<d_{vcor}$ AND $ton_3<d_{vcor}$ AND $ton_{LT}<d_{vcor}$ AND $FV_s(7)<d_{vcor}$ AND $FV_s(1)>d_{vcor}$ AND $FV_s(1)>0.76$, $cond_A$ may be set to 1.

The condition 2 ($cond_B$) may be defined, for example, as follows. That is, when $d_{vcor}<0.4$, $cond_B$ may be set to 1.

The condition 3 ($cond_C$) may be defined, for example, as follows. That is, when $0.26<ton_2<0.54$ AND $ton_3>0.22$ AND $0.26<ton_{LT}<0.54$ AND $LP_{err}>0.5$, $cond_C$ may be set to 1.

The condition 4 ($cond_C$) may be defined, for example, as follows. That is, when $ton_2<0.34$ AND $ton_3<0.26$ AND $0.26<ton_{LT}<0.45$, $cond_D$ may be set to 1.

A feature or a set of features used to generate each condition is not limited thereto. In addition, each constant value is only illustrative and may be set to an optimal value according to an implementation method.

According to an embodiment, the correcting unit 3730 may correct errors in the initial classification result by using two independent state machines, for example, a speech state machine and a music state machine. Each state machine has two states, and hangover may be used in each state to prevent frequent transitions. The hangover may include, for example, six frames. When a hangover variable in the speech state machine is indicated by $hang_{sp}$, and a hangover variable in the music state machine is indicated by $hang_{mus}$, if a classification result is changed in a given state, each variable is initialized to 6, and thereafter, hangover decreases by 1 for each subsequent frame. A state change may occur only when hangover decreases to zero. In each state machine, a correction parameter generated by combining at least one feature extracted from the audio signal may be used.

Figure 38:
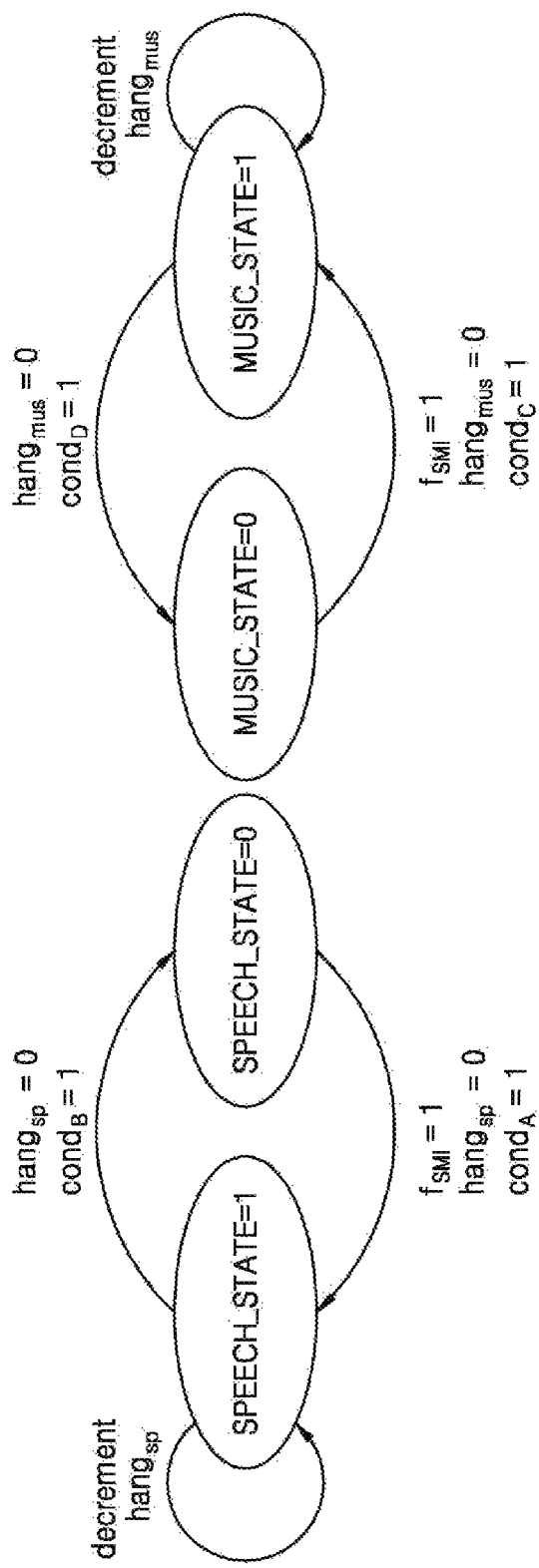
FIG. 38 illustrates a state machine used in a correction unit of FIG. 37 according to an exemplary embodiment.

FIG. 38 illustrates a state machine used in a correction unit 3730 of FIG. 37 according to an exemplary embodiment.

Referring to FIG. 38, a left side shows a state machine suitable for a CELP core, i.e. a state machine for context-based correction in a speech state, according to an embodiment. In the correction unit 3730, correction on a classification result may be applied according to a music state determined by the music state machine and a speech state determined by the speech state machine. For example, when an initial classification result is set to a music signal, the music signal may be changed to a speech signal based on correction parameters. In detail, when a classification result of a first operation of the initial classification result indicates a music signal, and the speech state is 1, both the classification result of the first operation and a classification result of a second operation may be changed to a speech signal. In this case, it may be determined that there is an error in the initial classification result, thereby correcting the classification result.

The above operation will be explained in detail as follows.

First, the correction parameters, e.g., the condition 1 and the condition 2, may be received. In addition, hangover information of the speech state machine may be received. An initial classification result may also be received. The initial classification result may be provided from the speech/music classifying unit 3710.

It may be determined whether the initial classification result, i.e., the speech state, is 0, the condition $1(\text{cond}_A)$ is 1, and the hangover $\text{hang}_{sp}$ of the speech state machine is 0. If it is determined that the initial classification result, i.e., the speech state, is 0, the condition 1 is 1, and the hangover $\text{hang}_{sp}$ of the speech state machine is 0, the speech state may be changed to 1, and the hangover may be initialized to 6.

Meanwhile, it may be determined whether the initial classification result, i.e., the speech state, is 1, the condition $2(\text{cond}_B)$ is 1, and the hangover $\text{hang}_{sp}$ of the speech state machine is 0. If it is determined that the speech state is 1, the condition 2 is 1, and the hangover $\text{hang}_{sp}$ of the speech state machine is 0, the speech state may be changed to 0, and the hangover$_{sp}$ may be initialized to 6. If the speech state is not 1, the condition 2 is not 1, or the hangover $\text{hang}_{sp}$ of the speech state machine is not 0, a hangover update for decreasing the hangover by 1 may be performed.

Referring to FIG. 38, a right side shows a state machine suitable for a high quality (HQ) core, i.e. a state machine for context-based correction in a music state, according to an embodiment. In the correction unit 3730, correction on a classification result may be applied according to a music state determined by the music state machine and a speech state determined by the speech state machine. For example, when an initial classification result is set to a speech signal, the speech signal may be changed to a music signal based on correction parameters. In detail, when a classification result of a first operation of the initial classification result indicates a speech signal, and the music state is 1, both the classification result of the first operation and a classification result of a second operation may be changed to a music signal. When the initial classification result is set to a music signal, the music signal may be changed to a speech signal based on correction parameters. In this case, it may be determined that there is an error in the initial classification result, thereby correcting the classification result.

The above operation will be explained in detail as follows.

First, the correction parameters, e.g., the condition 3 and the condition 4, may be received. In addition, hangover information of the music state machine may be received. An initial classification result may also be received. The initial classification result may be provided from the speech/music classifying unit 3710.

It may be determined whether the initial classification result, i.e., the music state, is 0, the condition $3(\text{cond}_C)$ is 1, and the hangover $\text{hang}_{mus}$ of the music state machine is 0. If it is determined that the initial classification result, i.e., the music state, is 0, the condition 3 is 1, and the hangover $\text{hang}_{mus}$ of the music state machine is 0, the music state may be changed to 1, and the hangover may be initialized to 6.

It may be determined whether the initial classification result, i.e., the music state, is 1, the condition $4(\text{cond}_D)$ is 1, and the hangover $\text{hang}_{mus}$ of the music state machine is 0. If it is determined that the music state is 1, the condition 4 is 1, and the hangover $\text{hang}_{mus}$ of the music state machine is 0, the music state may be changed to 0, and the hangover $\text{hang}_{mus}$ may be initialized to 6. If the music state is not 1, the condition 4 is not 1, or the hangover $\text{hang}_{mus}$ of the music state machine is not 0, a hangover update for decreasing the hangover by 1 may be performed.

The above-described exemplary embodiments may be written as computer-executable programs and may be implemented in general-use digital computers that execute the programs by using a non-transitory computer-readable recording medium. In addition, data structures, program instructions, or data files, which can be used in the embodiments, can be recorded on a non-transitory computer-readable recording medium in various ways. The non-transitory computer-readable recording medium is any data storage device that can store data which can be thereafter read by a computer system. Examples of the non-transitory computer-readable recording medium include magnetic storage media, such as hard disks, floppy disks, and magnetic tapes, optical recording media, such as CD-ROMs and DVDs, magneto-optical media, such as optical disks, and hardware devices, such as ROM, RAM, and flash memory, specially configured to store and execute program instructions. In addition, the non-transitory computer-readable recording medium may be a transmission medium for transmitting signal designating program instructions, data structures, or the like. Examples of the program instructions may include not only mechanical language codes created by a compiler but also high-level language codes executable by a computer using an interpreter or the like.

While the exemplary embodiments have been particularly shown and described, it will be understood by those of ordinary skill in the art that various changes in form and details may be made therein without departing from the spirit and scope of the inventive concept as defined by the appended claims. It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

The invention claimed is:

1. A spectrum coding method comprising:
   quantizing spectral data of a non-zero band by using uniform scalar quantization (USQ);
   extracting a lower bit from the quantized spectral data;
   generating a sequence of lower bits by collecting lower bits of the quantized spectral data for all non-zero bands;
   quantizing the sequence of lower bits by using Trellis coded quantization (TCQ);
   generating a bitstream based on upper bits except for the lower bit in the quantized spectral data and the quantized sequence of lower bits,
   wherein a number of bits used for TCQ is extracted evenly from a number of bits allocated for quantization of each non-zero band, and wherein a remaining number of bits in the non-zero band is used for USQ.

2. The method of claim 1, wherein the quantizing the sequence of lower bits is performed based on a difference between the spectral data and the quantized spectral data.

3. The method of claim 1, wherein a bandwidth of the spectral data is either a super wide band or a full band.

4. The method of claim 1, wherein the generating of the bitstream comprises:
- performing first lossless coding on a number, a position and a sign of an important spectral component of the non-zero band;
- performing second lossless coding on magnitude information which is constructed by excluding the lower bit from the quantized spectral data;
- performing third lossless coding on the quantized sequence of the lower bits; and
- generating the bitstream by using data provided from the first lossless coding, the second lossless coding and the third lossless coding.

5. The method of claim 1, wherein the spectral data is obtained by performing modified discrete cosine transform and normalization on an input audio signal.

6. A spectrum coding apparatus comprising at least one processor configured to:
- quantize spectral data of a non-zero band by using uniform scalar quantization (USQ);
- extract a lower bit from the quantized spectral data;
- generate a sequence of lower bits by collecting lower bits of the quantized spectral data for all non-zero bands;
- quantize the sequence of lower bits by using Trellis coded quantization (TCQ);
- generate a bitstream based on upper bits except for the lower bit in the quantized spectral data and the quantized sequence of lower bits, wherein a number of bits used for TCQ is extracted evenly from a number of bits allocated for quantization of each non-zero band, and wherein a remaining number of bits in the non-zero band is used for USQ.

7. The spectrum coding apparatus of claim 6, wherein the at least one processor is configured to quantize the sequence of lower bits based on a difference between the spectral data and the quantized spectral data.

8. The spectrum coding apparatus of claim 6, wherein a bandwidth of the spectral data is either a super wide band or a full band.

9. The spectrum coding apparatus of claim 6, wherein the at least one processor is configured to:
- perform first lossless coding on a number, a position and a sign of an important spectral component of the non-zero band;
- perform second lossless coding on magnitude information which is constructed by excluding the lower bit from the quantized spectral data;
- perform third lossless coding on the quantized sequence of the lower bits; and
- generate the bitstream by using data provided from the first lossless coding, the second lossless coding and the third lossless coding.

10. The spectrum coding apparatus of claim 6, wherein the spectral data is obtained by performing modified discrete cosine transform and normalization on an input audio signal.

* * * * *